(12) United States Patent
Ciplickas et al.

(10) Patent No.: US 7,527,987 B2
(45) Date of Patent: May 5, 2009

(54) FAST LOCALIZATION OF ELECTRICAL FAILURES ON AN INTEGRATED CIRCUIT SYSTEM AND METHOD

(75) Inventors: Dennis Ciplickas, San Jose, CA (US); Christopher Hess, San Carlos, CA (US); Sherry Lee, San Jose, CA (US); Larg Weiland, Livermore, CA (US)

(73) Assignee: PDF Solutions, Inc., San Jose, CA (US)

( * ) Notice: Subject to any disclaimer, the term of this patent is extended or adjusted under 35 U.S.C. 154(b) by 335 days.

(21) Appl. No.: 10/538,538

(22) PCT Filed: Dec. 11, 2003

(86) PCT No.: PCT/US03/39698

§ 371 (c)(1), (2), (4) Date: Jun. 10, 2005

(87) PCT Pub. No.: WO2004/053944

PCT Pub. Date: Jun. 24, 2004

(65) Prior Publication Data

US 2006/0105475 A1    May 18, 2006

Related U.S. Application Data

(60) Provisional application No. 60/432,786, filed on Dec. 11, 2002.

(51) Int. Cl.
*H01L 21/66* (2006.01)
*G01R 31/26* (2006.01)

(52) U.S. Cl. .......... 438/14; 257/48; 257/E21.525
(58) Field of Classification Search ............ 257/48, 257/E21.525; 438/14
See application file for complete search history.

(56) References Cited

U.S. PATENT DOCUMENTS

| | | | |
|---|---|---|---|
| 4,912,052 A | | 3/1990 | Miyoshi et al. |
| 5,457,400 A | * | 10/1995 | Ahmad et al. ............ 324/763 |
| 5,500,603 A | | 3/1996 | Le |
| 5,606,527 A | * | 2/1997 | Kwack et al. ............ 365/201 |
| 5,666,049 A | * | 9/1997 | Yamada et al. .......... 324/158.1 |
| 5,831,446 A | * | 11/1998 | So et al. ................. 324/763 |
| 6,137,303 A | | 10/2000 | Deckert et al. |

(Continued)

OTHER PUBLICATIONS

China Office Action with English translation mailed Mar. 9, 2007, for China Application No. 200380105680.3, eight pages.

(Continued)

*Primary Examiner*—Marcos D. Pizarro
*Assistant Examiner*—Igwe U. Anya
(74) *Attorney, Agent, or Firm*—Morrison & Foerster LLP

(57) ABSTRACT

Fast localization of electrically measured defects of integrated circuits includes providing information for fabricating a test chip having test structures configured for parallel electrical testing. The test structures on the test chip are electrically tested employing a parallel electrical tester. The results of the electrical testing are analyzed to localize defects on the test chip.

56 Claims, 27 Drawing Sheets

U.S. PATENT DOCUMENTS

| | | | |
|---|---|---|---|
| 6,233,184 B1 * | 5/2001 | Barth et al. | 365/201 |
| 6,291,254 B1 * | 9/2001 | Chou et al. | 438/18 |
| 6,313,652 B1 | 11/2001 | Maeng | |
| 6,323,664 B1 * | 11/2001 | Kim et al. | 324/754 |
| 6,358,762 B1 | 3/2002 | Kohno et al. | |
| 6,449,748 B1 | 9/2002 | Stine | |
| 6,462,569 B2 | 10/2002 | Chen | |
| 6,475,871 B1 * | 11/2002 | Stine et al. | 438/381 |
| 6,551,844 B1 * | 4/2003 | Eldridge et al. | 438/14 |
| 6,615,391 B2 * | 9/2003 | Brown et al. | 716/4 |
| 6,727,722 B2 * | 4/2004 | Whetsel | 324/765 |
| 6,771,806 B1 * | 8/2004 | Satya et al. | 382/149 |
| 6,836,133 B2 * | 12/2004 | Kinoshita | 324/765 |
| 7,173,444 B2 * | 2/2007 | Pourkeramati et al. | 324/765 |
| 2002/0089345 A1 * | 7/2002 | Doong et al. | 324/765 |
| 2003/0067016 A1 * | 4/2003 | Koga et al. | 257/200 |
| 2003/0074611 A1 * | 4/2003 | Nachumovsky | 714/718 |
| 2004/0094762 A1 * | 5/2004 | Hess et al. | 257/48 |

OTHER PUBLICATIONS

International Search Report issued for PCT Patent Application No. PCT/US03/39698 mailed on Jul. 21, 2004, four pages.

* cited by examiner

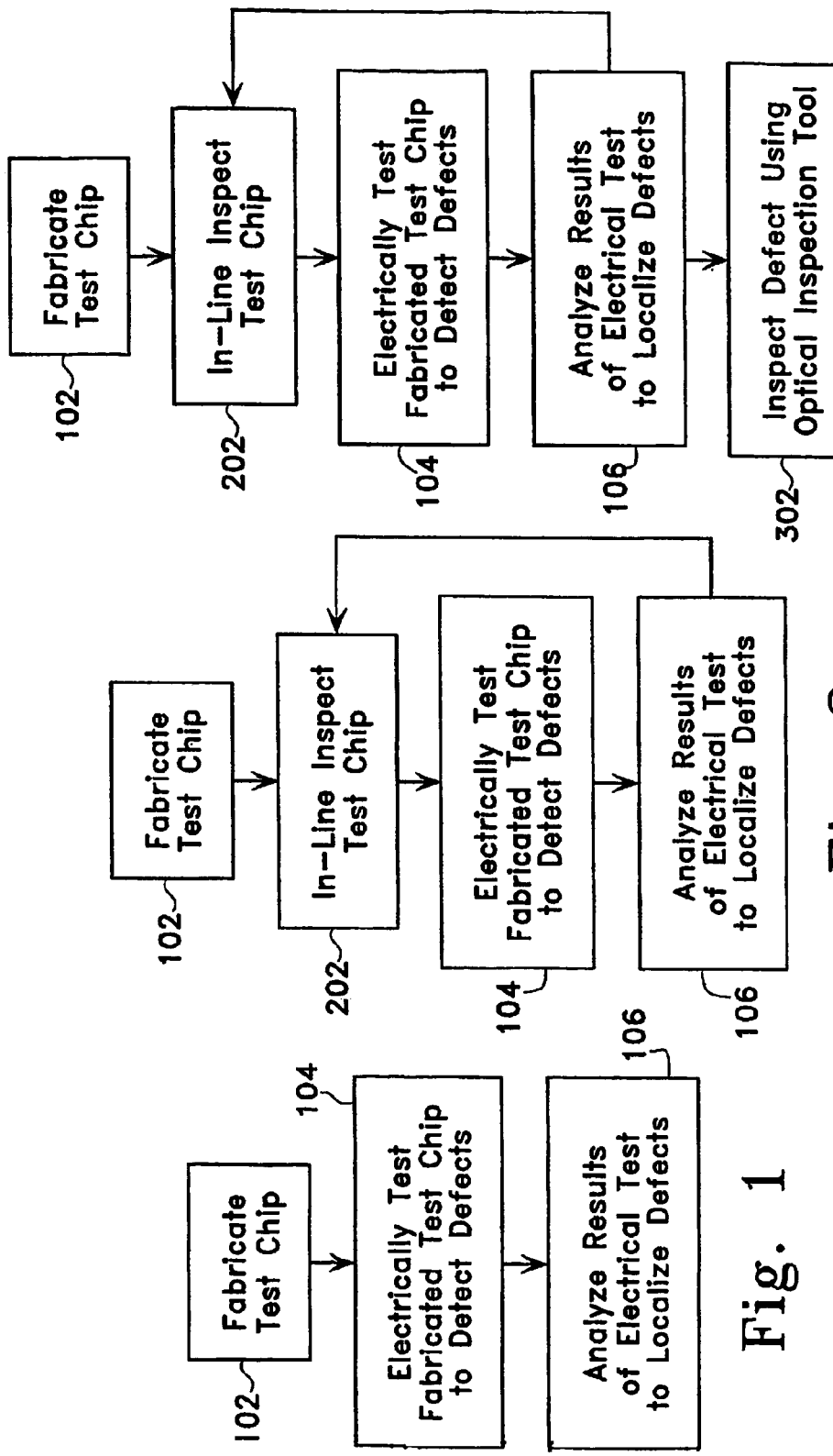

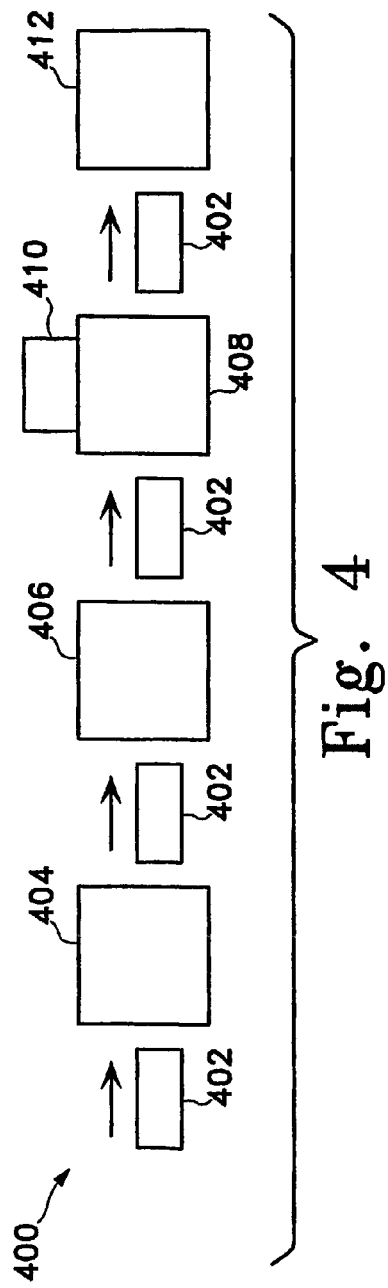
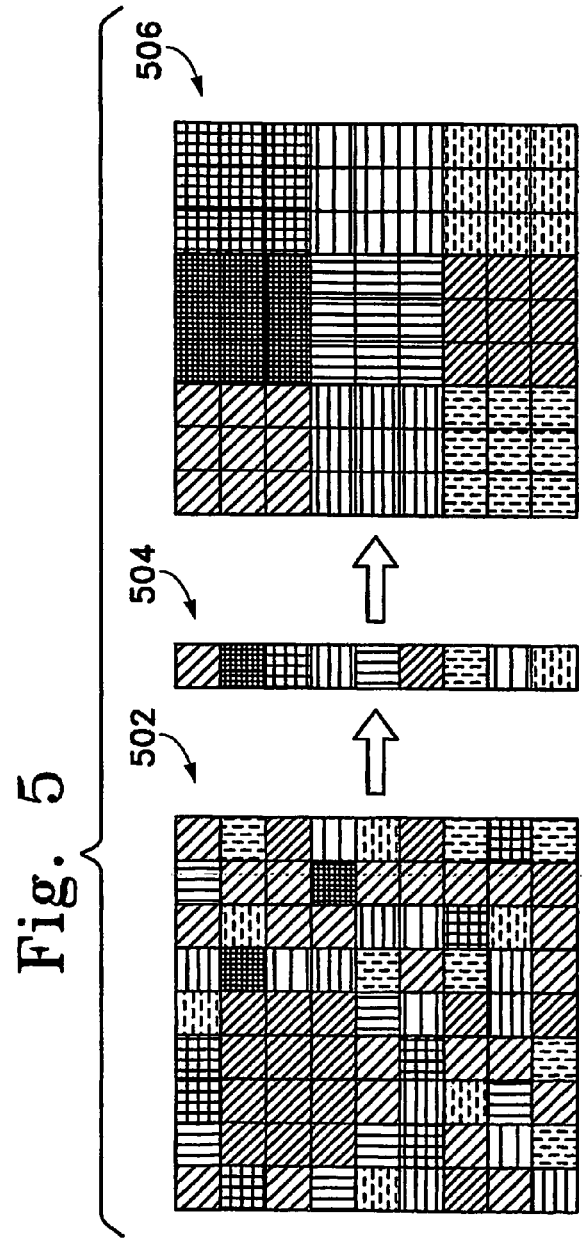

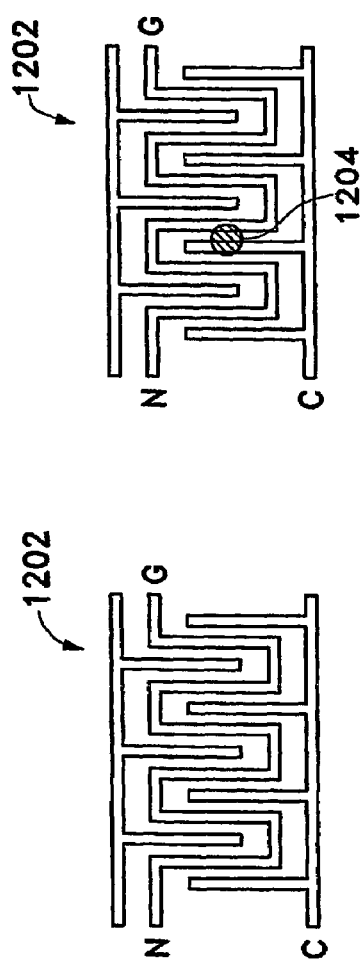
Fig. 12A
Fig. 12B
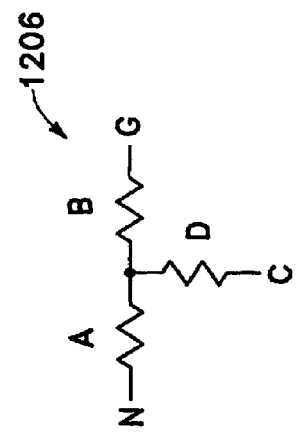
Fig. 12C

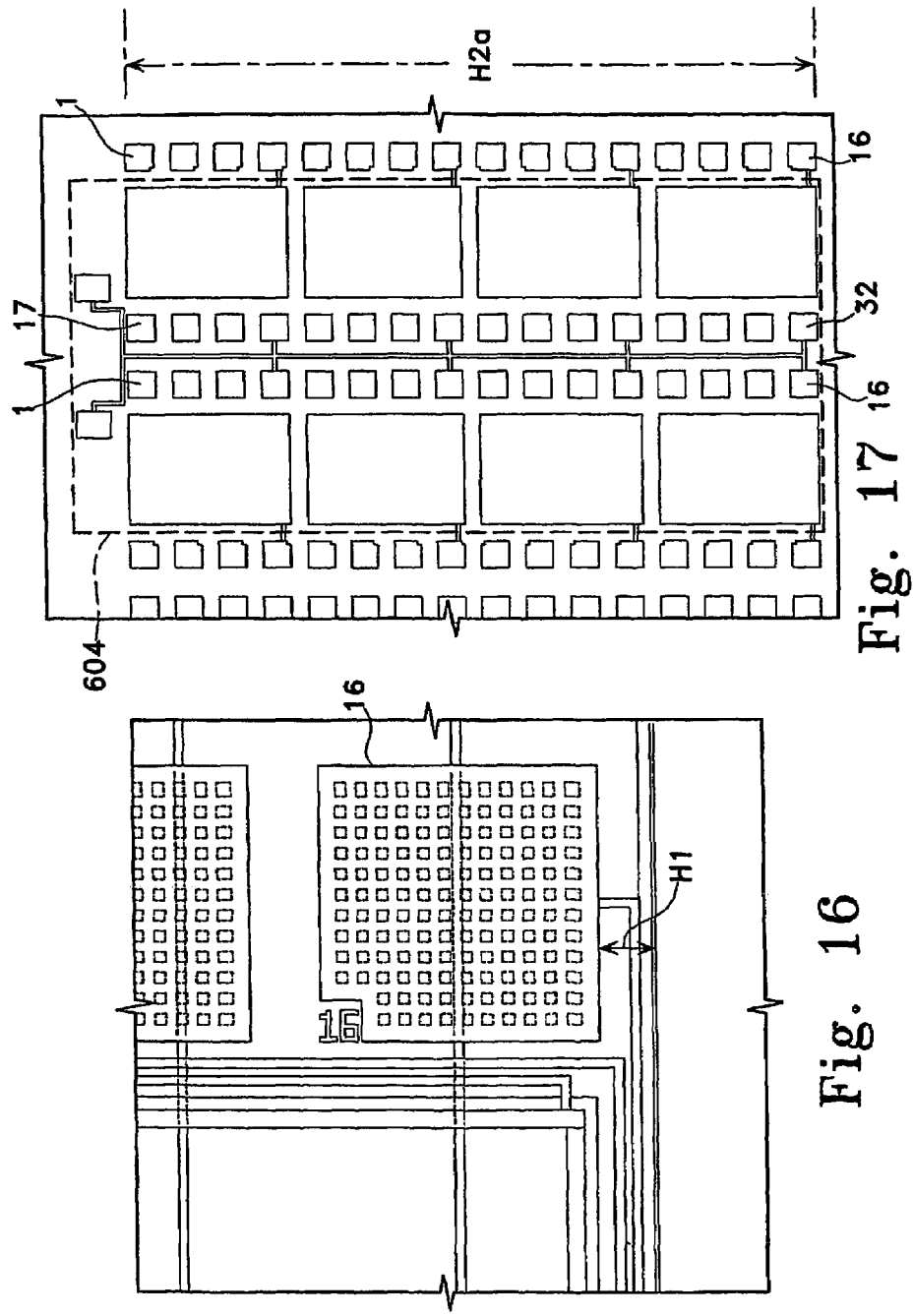

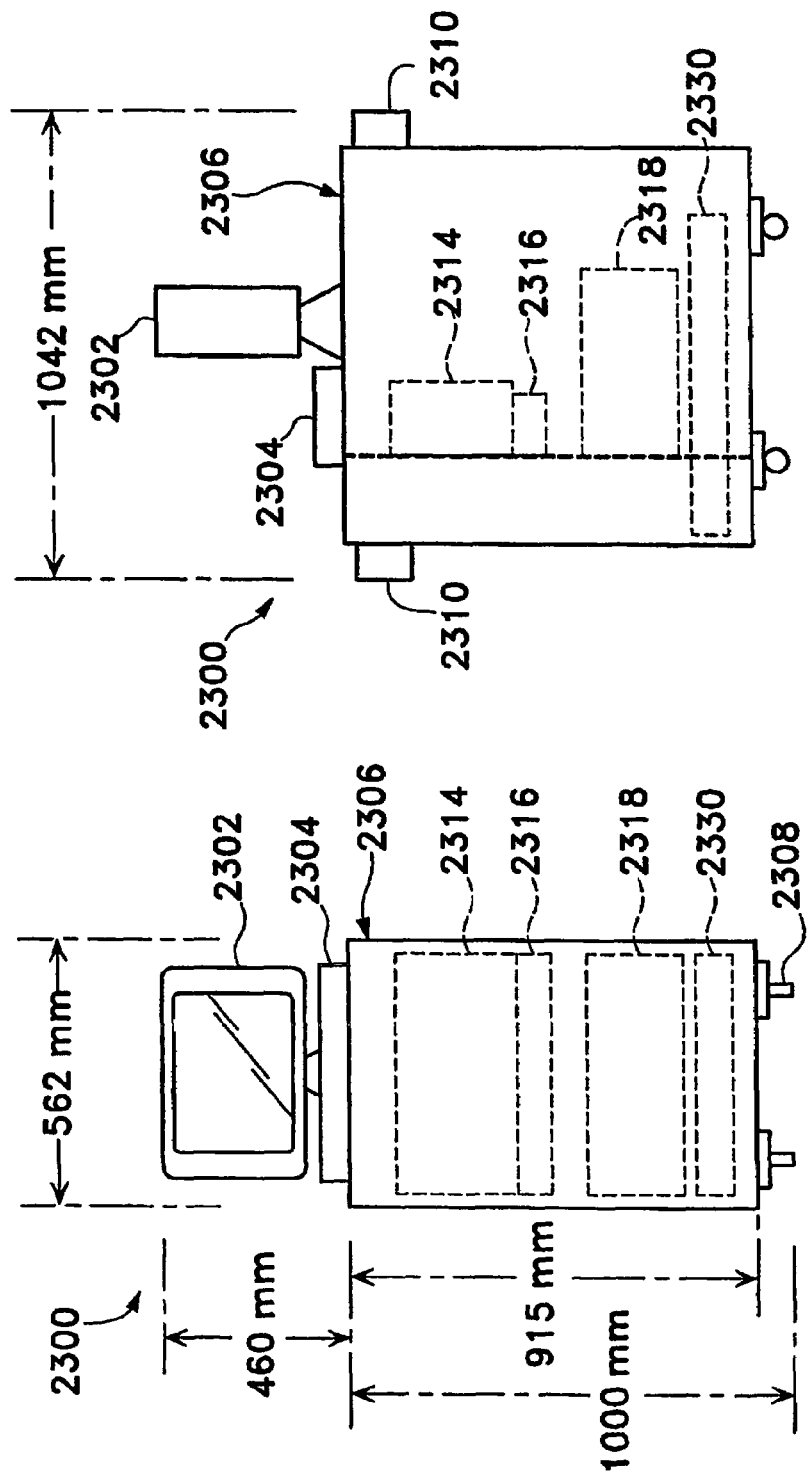

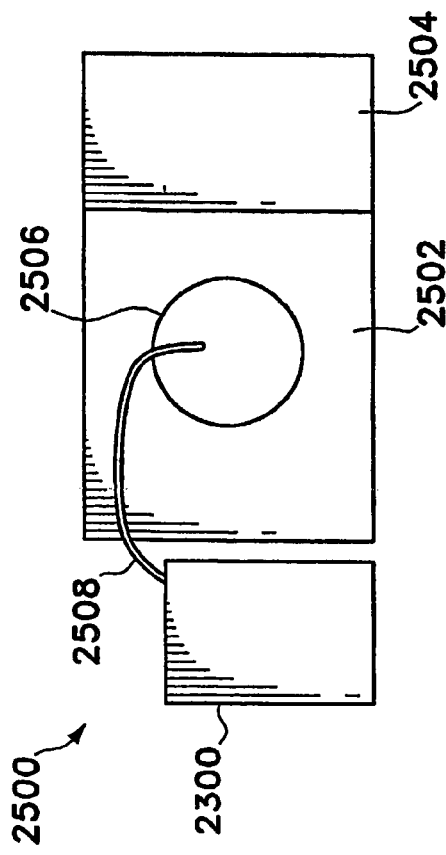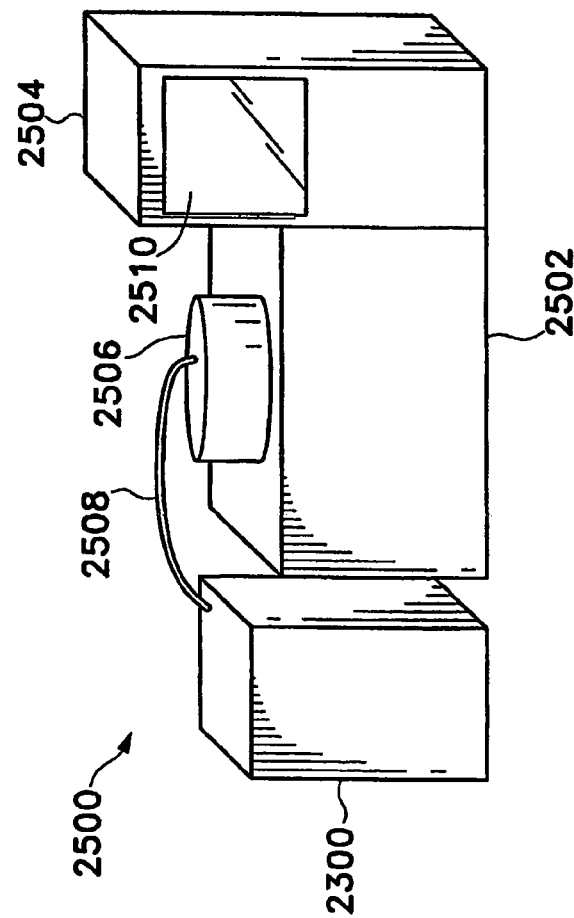

FAST LOCALIZATION OF ELECTRICAL FAILURES ON AN INTEGRATED CIRCUIT SYSTEM AND METHOD

CROSS-REFERENCE TO RELATED APPLICATIONS

This application is a National Stage of International Application No. PCT/US03/39698, filed Dec. 11, 2003, and claims the benefit of U.S. Provisional Application No. 60/432,786, filed Dec. 11, 2002, the entire content of which is incorporated herein by reference.

BACKGROUND

1. Field of the Invention

The present application relates to fast localization of electrical failures on an integrated circuit.

2. Related Art

The fabrication of integrated circuits is an extremely complex process that may involve hundreds of individual operations. For a number of reasons, defects can be introduced into the integrated circuits during these operations. For example, in photoresist and photomask operations, the presence of contaminants such as dust, minute scratches and other imperfections in the patterns on the photomasks can produce defective patterns on the semiconductor wafers, resulting in defective integrated circuits.

Defective integrated circuits may be identified both by visual inspection under high magnification and by electrical tests. Once a defective integrated circuit has been identified, the location of the defect in the integrated circuit is typically determined to permit closer inspection of the defect. Conventional techniques for detecting and localizing the defects typically test integrated circuits individually, which can be time consuming, particularly when the number of integrated circuits being tested is large.

SUMMARY

In one exemplary embodiment, fast localization of electrically measured defects of integrated circuits includes providing information for fabricating a test chip having test structures configured for parallel electrical testing. The test structures on the test chip are electrically tested employing a parallel electrical tester. The results of the electrical testing are analyzed to localize defects on the test chip.

DESCRIPTION OF DRAWING FIGURES

The present application can be best understood by reference to the following description taken in conjunction with the accompanying drawing figures, in which like parts may be referred to by like numerals:

FIG. 1 is a flow diagram of an exemplary process of localizing defects on a test chip;

FIG. 2 is a flow diagram of another exemplary process of localizing defects on a test chip;

FIG. 3 is a flow diagram of another exemplary process of localizing defects on a test chip;

FIG. 4 is a block diagram of an exemplary system to localize defects on a test chip;

FIG. 5 depicts a product chip with design pattern variations;

Figure 11:
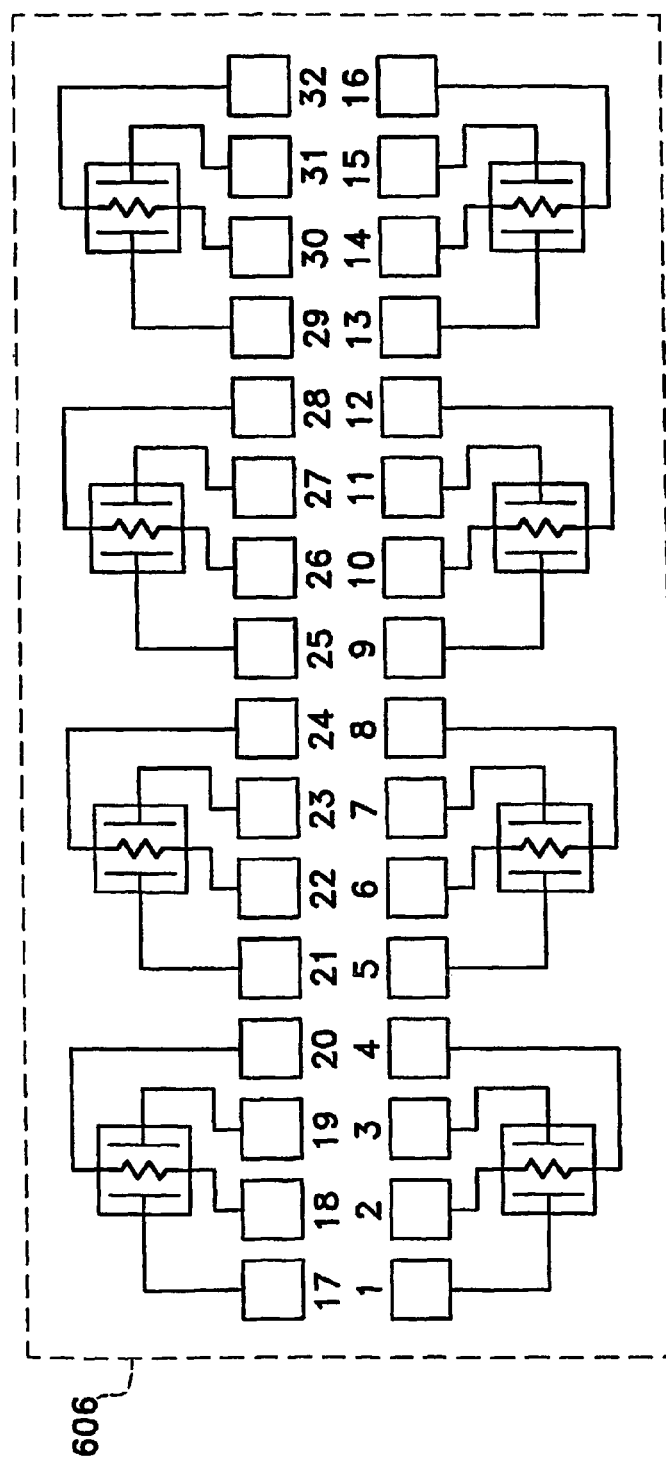
Figure 13:
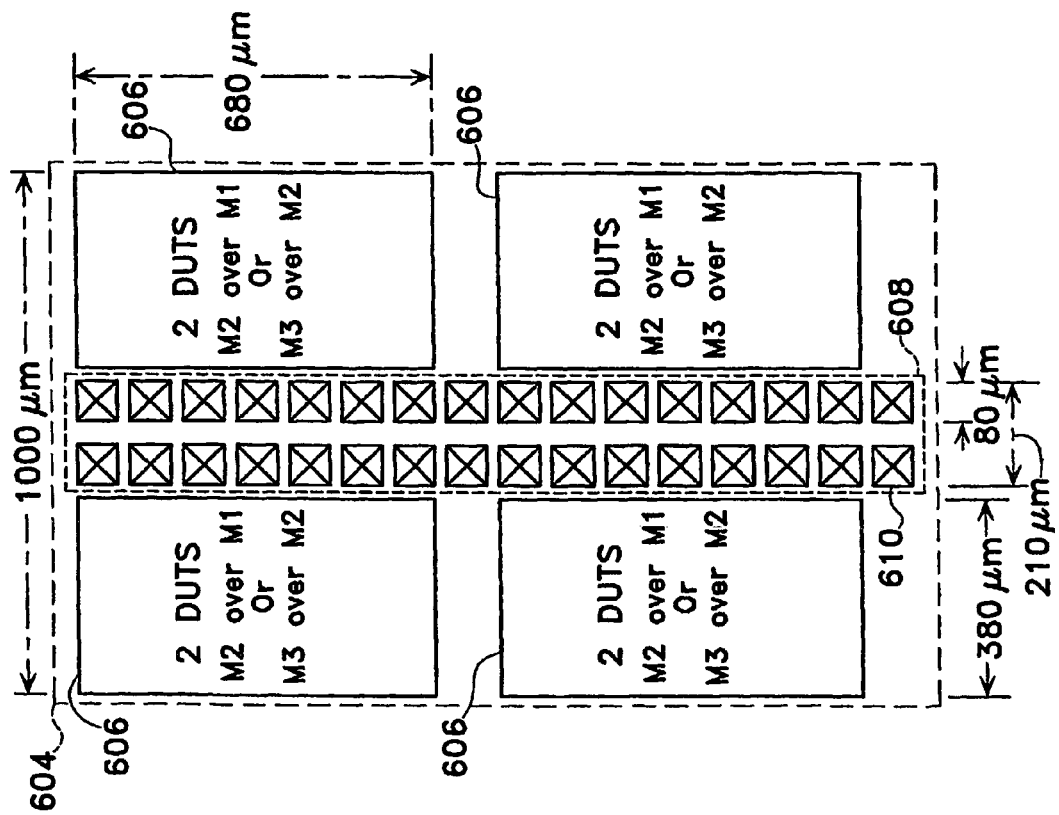

FIGS. 11, 12-A, 12-B, and 12-C depict exemplary test structures;

FIG. 13 depicts another exemplary padgroup.

Figure 22:
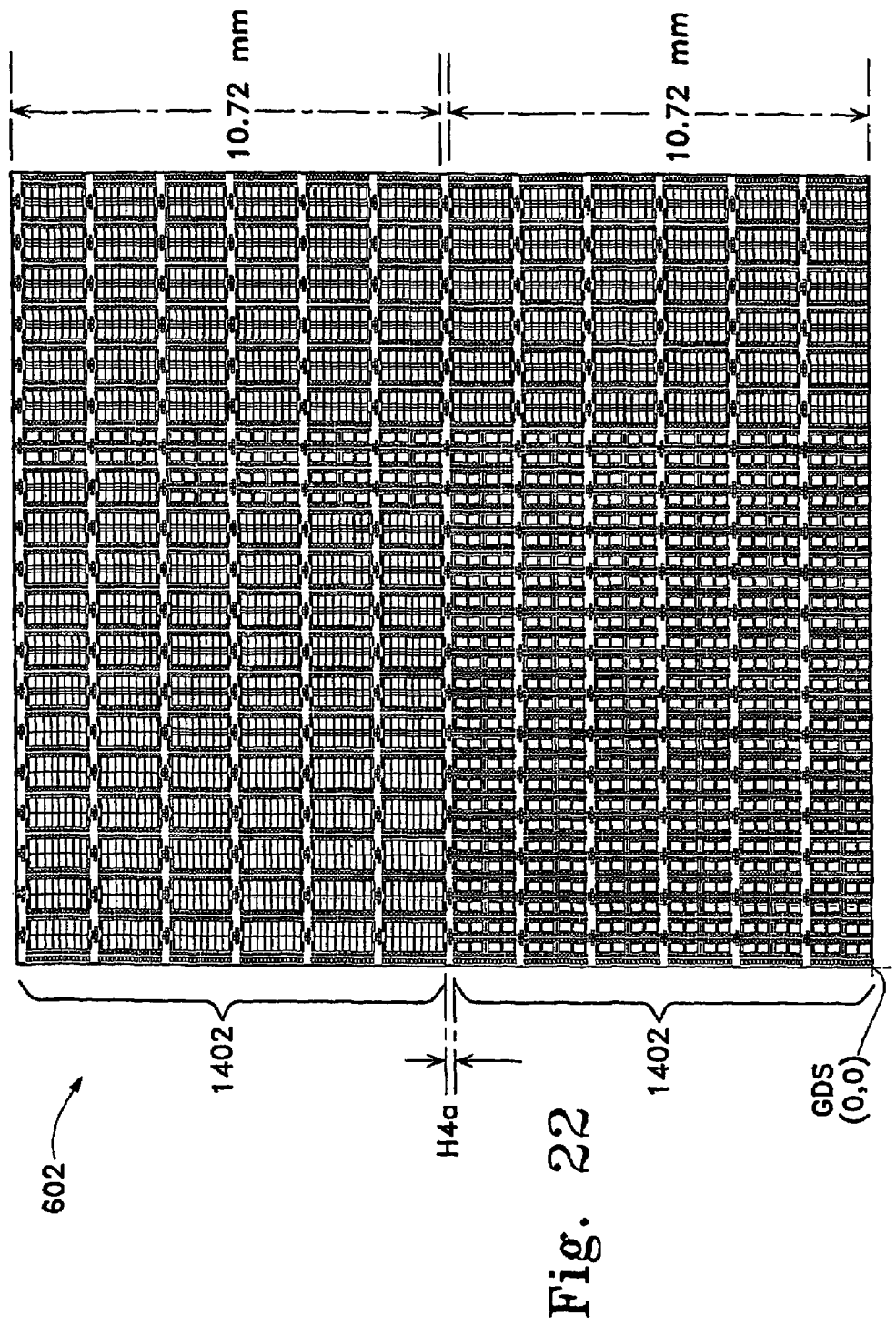
Figure 27:
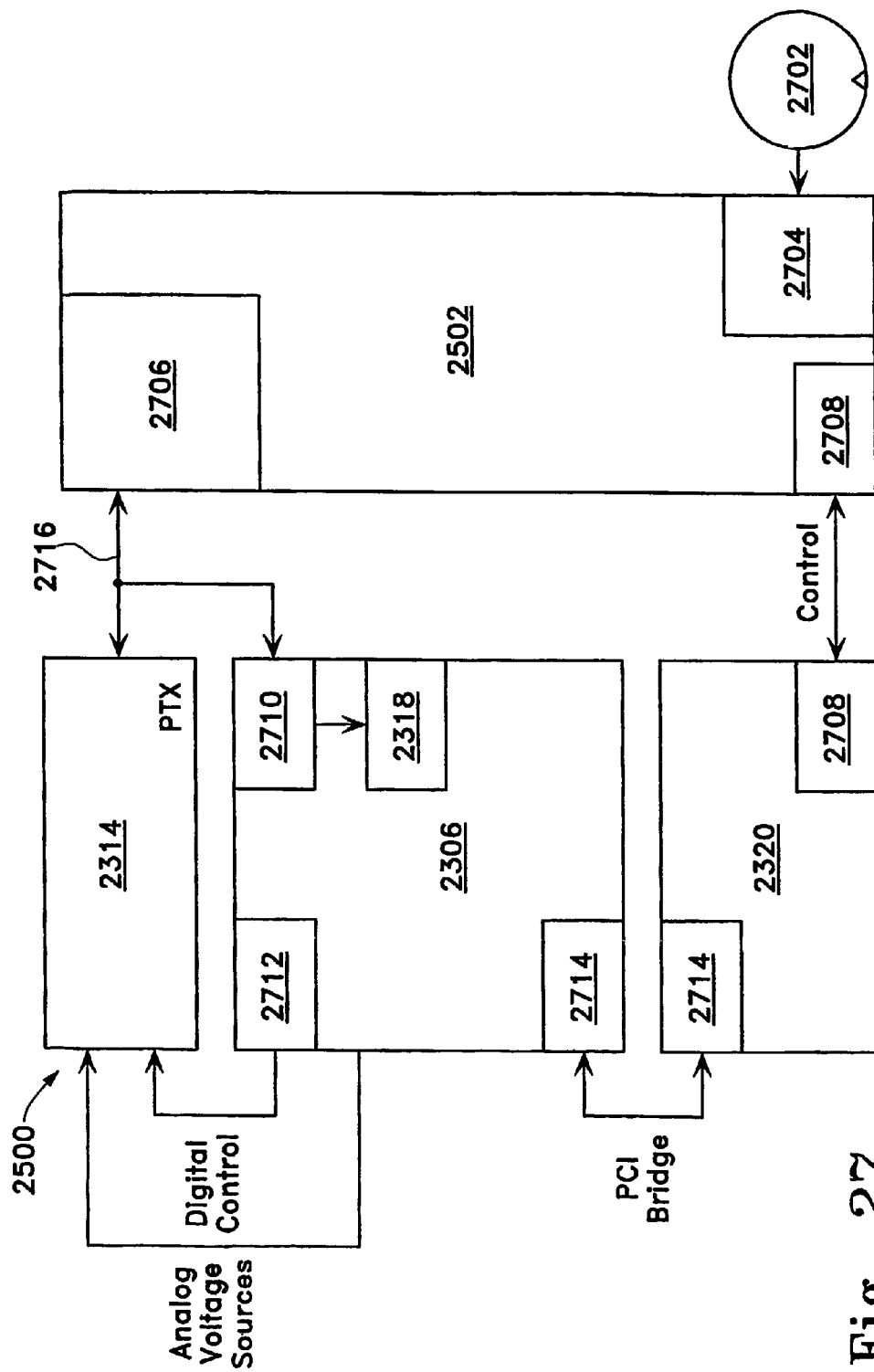
Figure 28:
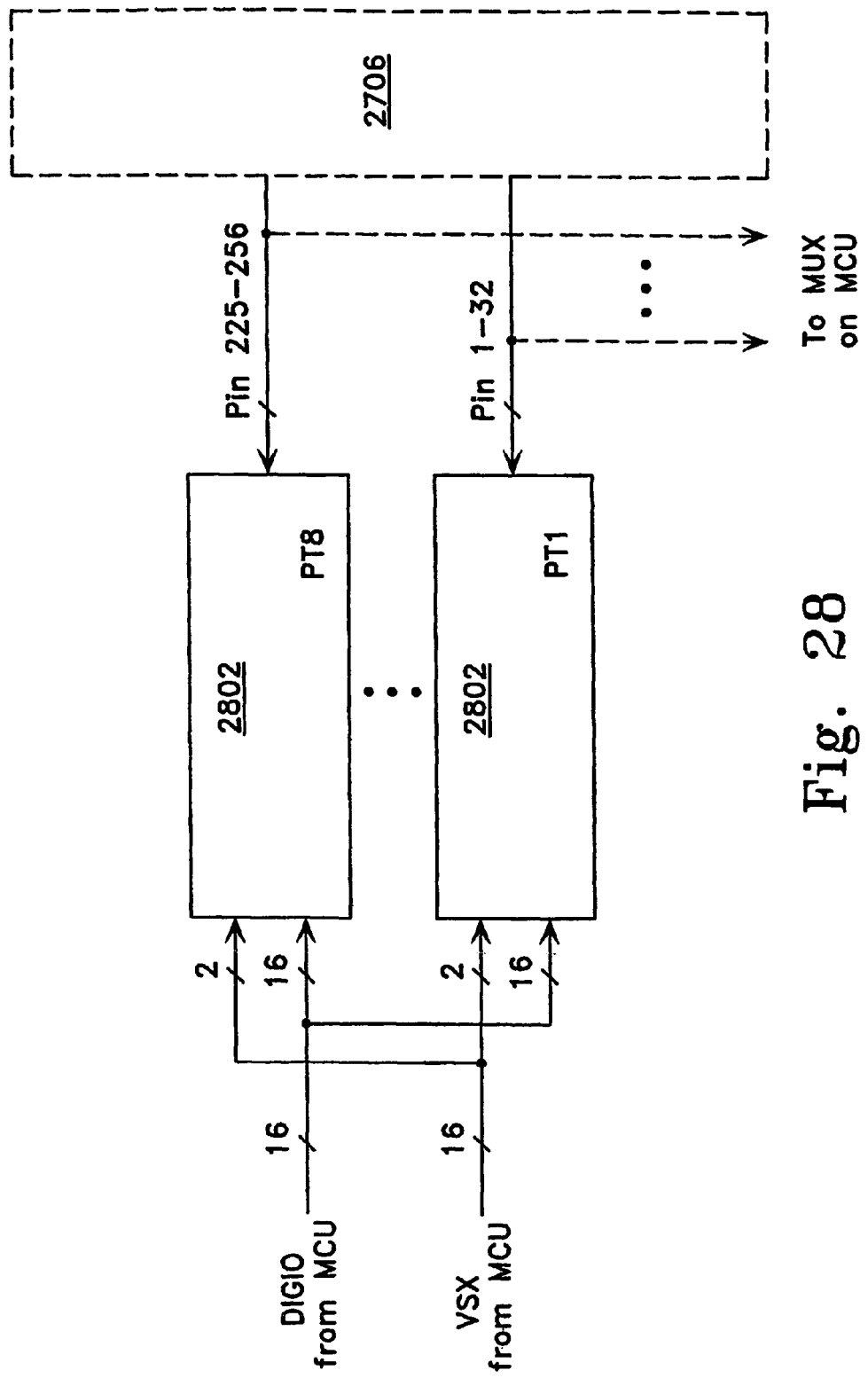
Figure 29:
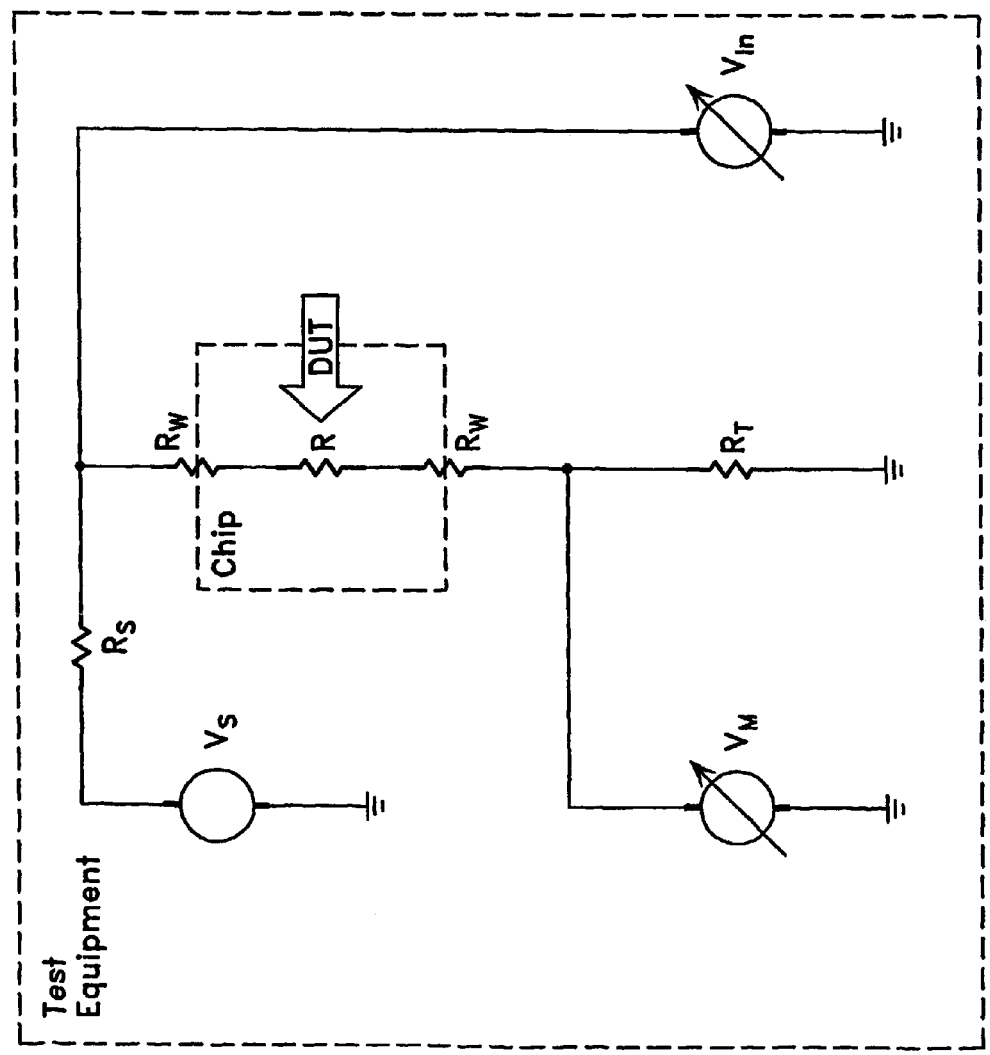
Figure 30:
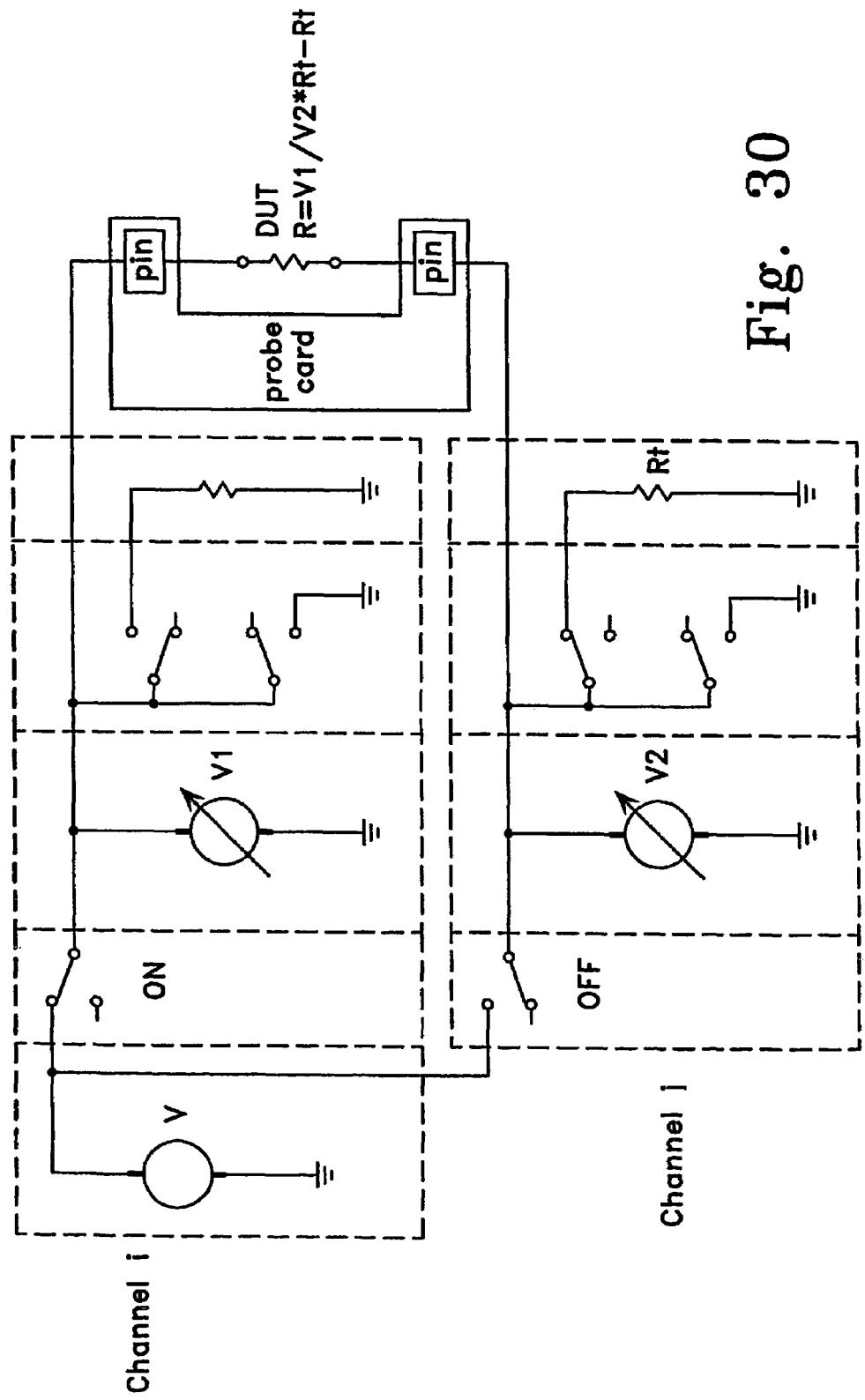
Figure 31:
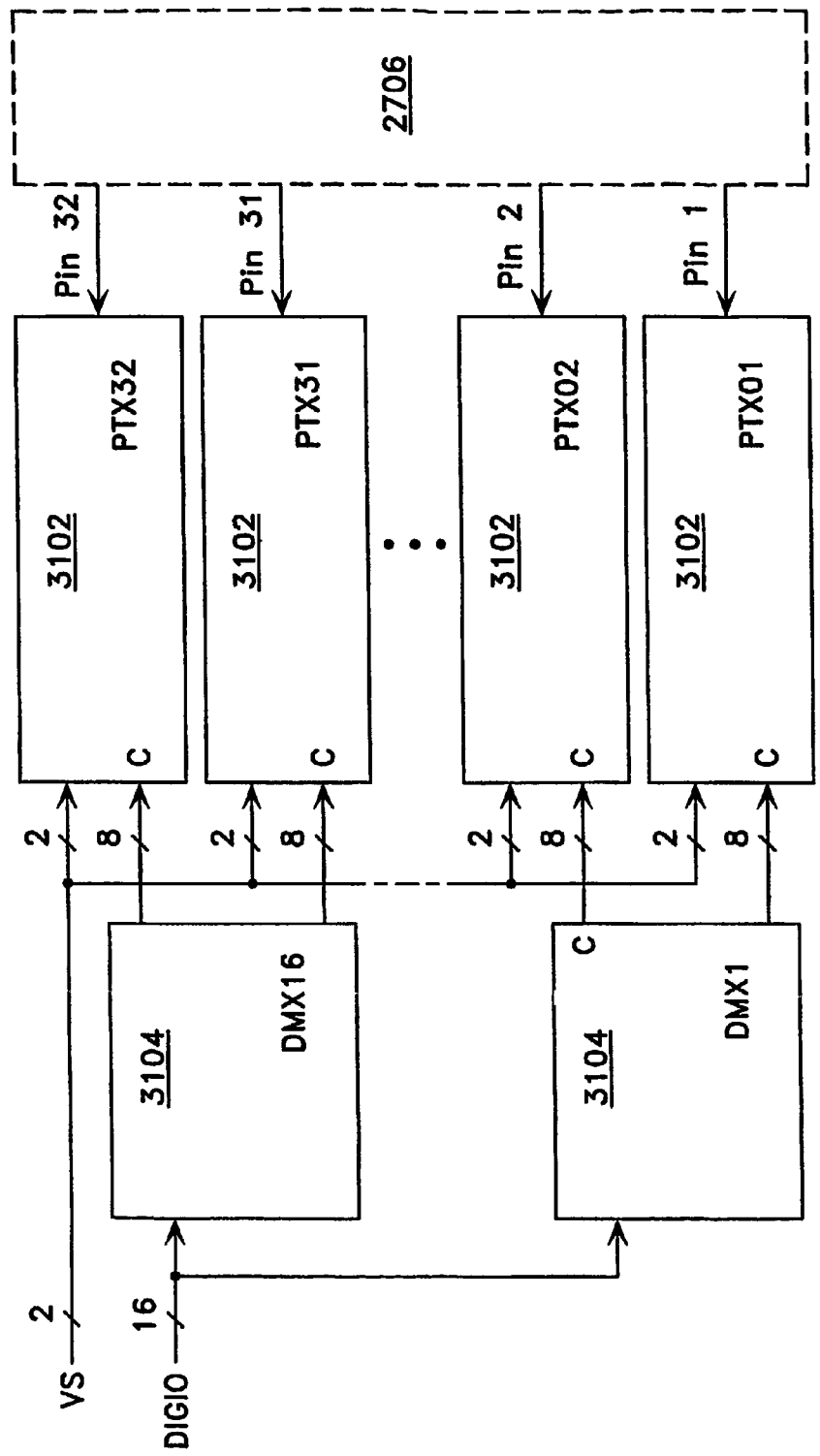
Figure 32:
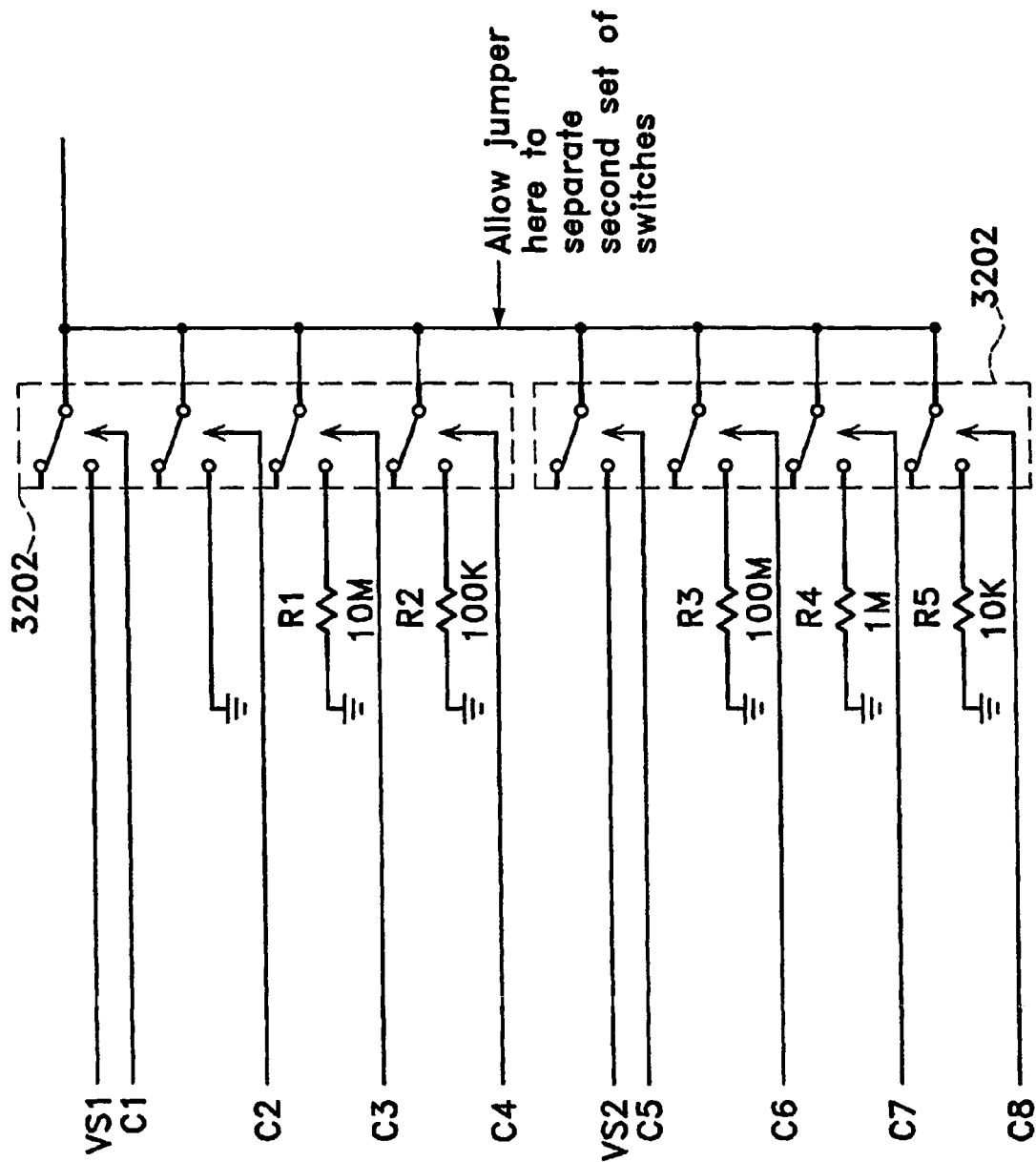
Figure 33:
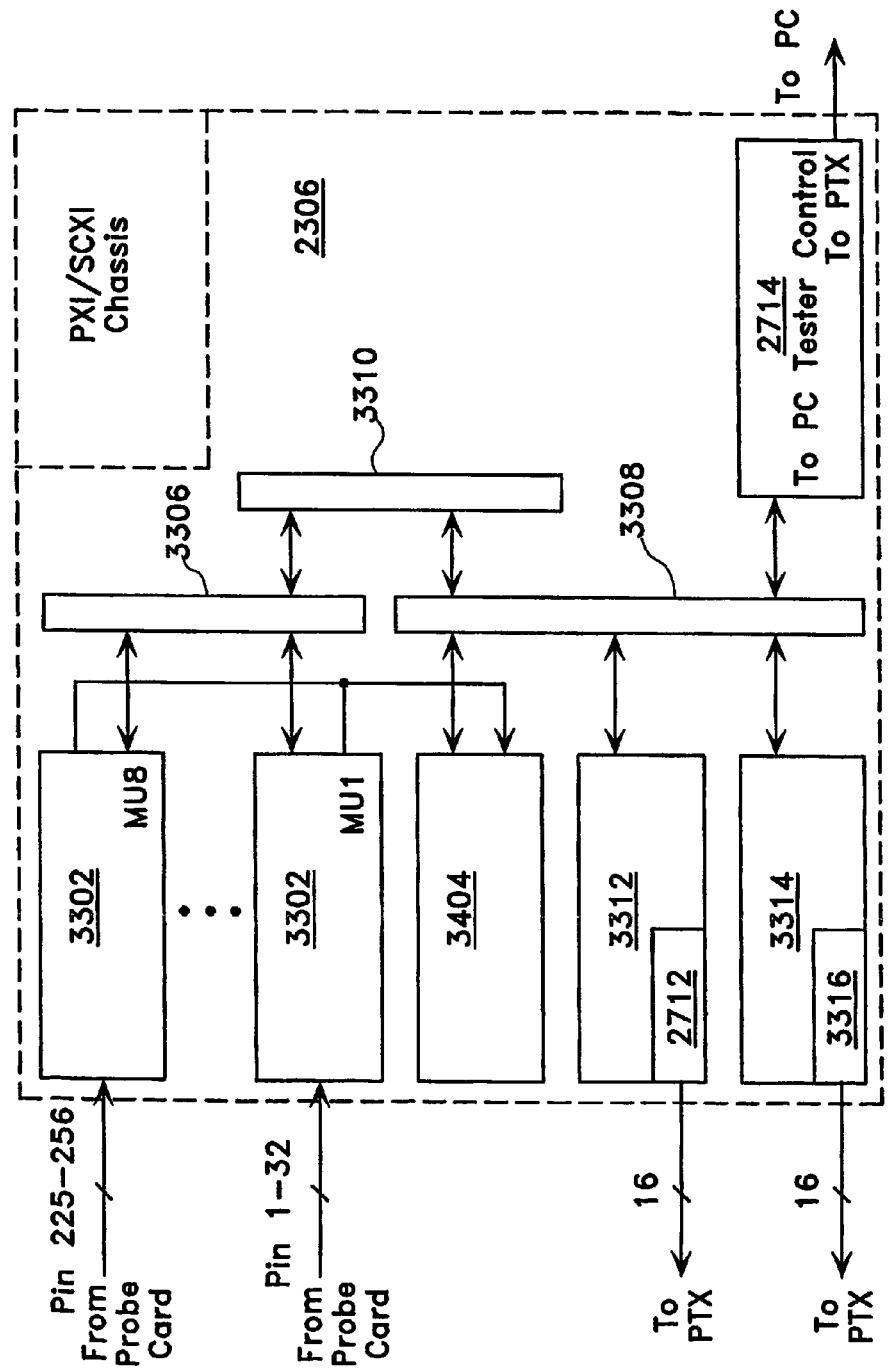
Figure 34:
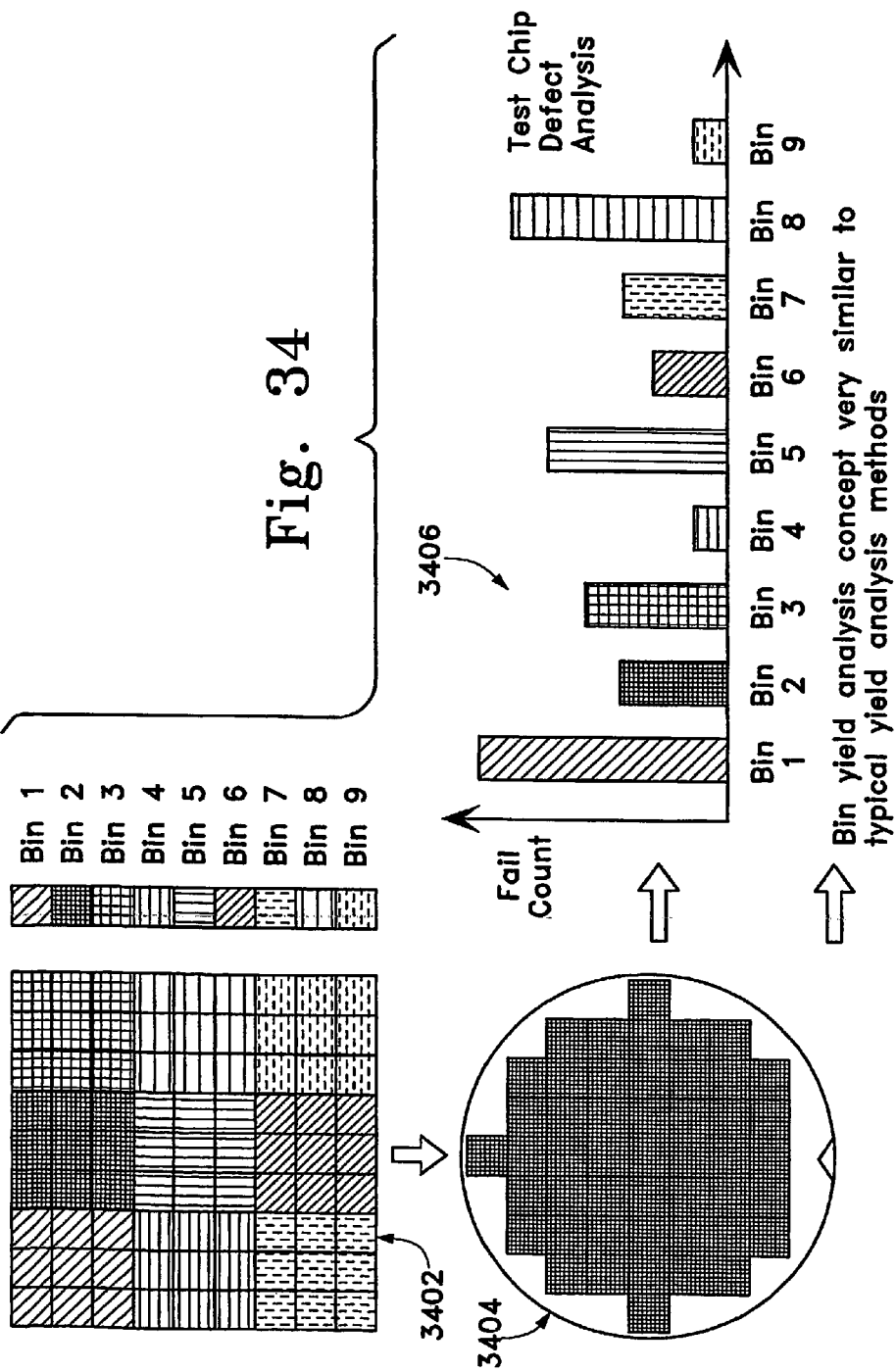

FIGS. 14-21 depict portions of another exemplary layout;

FIG. 22 depicts another exemplary layout;

FIG. 23 is a front view of an exemplary parallel tester;

FIG. 24 is a side of the exemplary parallel tester depicted in FIG. 23;

FIG. 25 is a top view of an exemplary wafer tester system;

FIG. 26 is a perspective view of the exemplary wafer tester system depicted in FIG. 25;

FIG. 27 is a system block diagram of the wafer tester system depicted in FIG. 25;

FIG. 28 is a system block diagram of a portion of the wafer tester system depicted in FIG. 25;

FIG. 29 is a circuit diagram of a resistor divider;

FIG. 30 is a circuit diagram of a two point resistance measurement implementation;

FIG. 31 is a system block diagram of a portion of a switch card;

FIG. 32 is a circuit diagram of a portion of a pin terminator circuit;

FIG. 33 is a system block diagram of a measurement control (MC) unit;

FIG. 34 depicts an exemplary process of defect analysis; and

Figure 35:
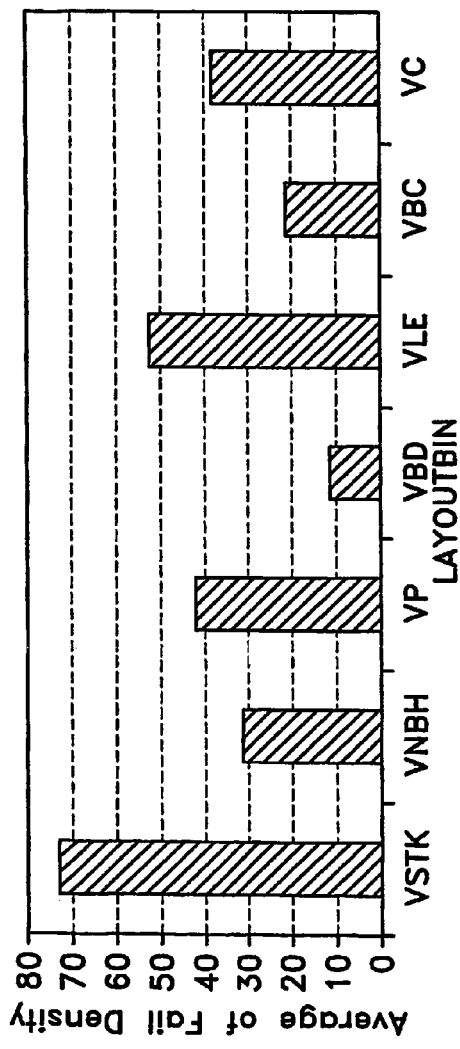
Figure 36:
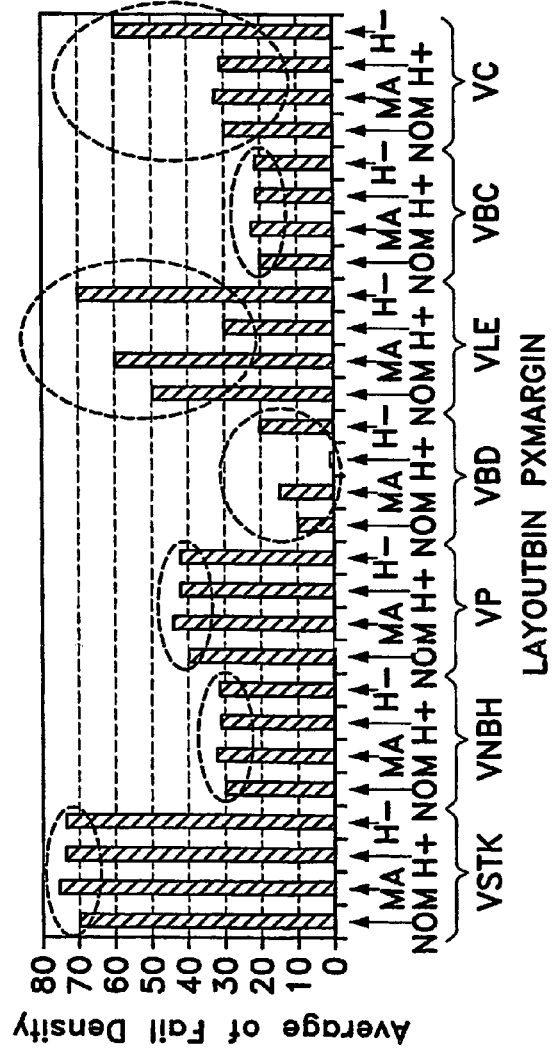
Figure 37:
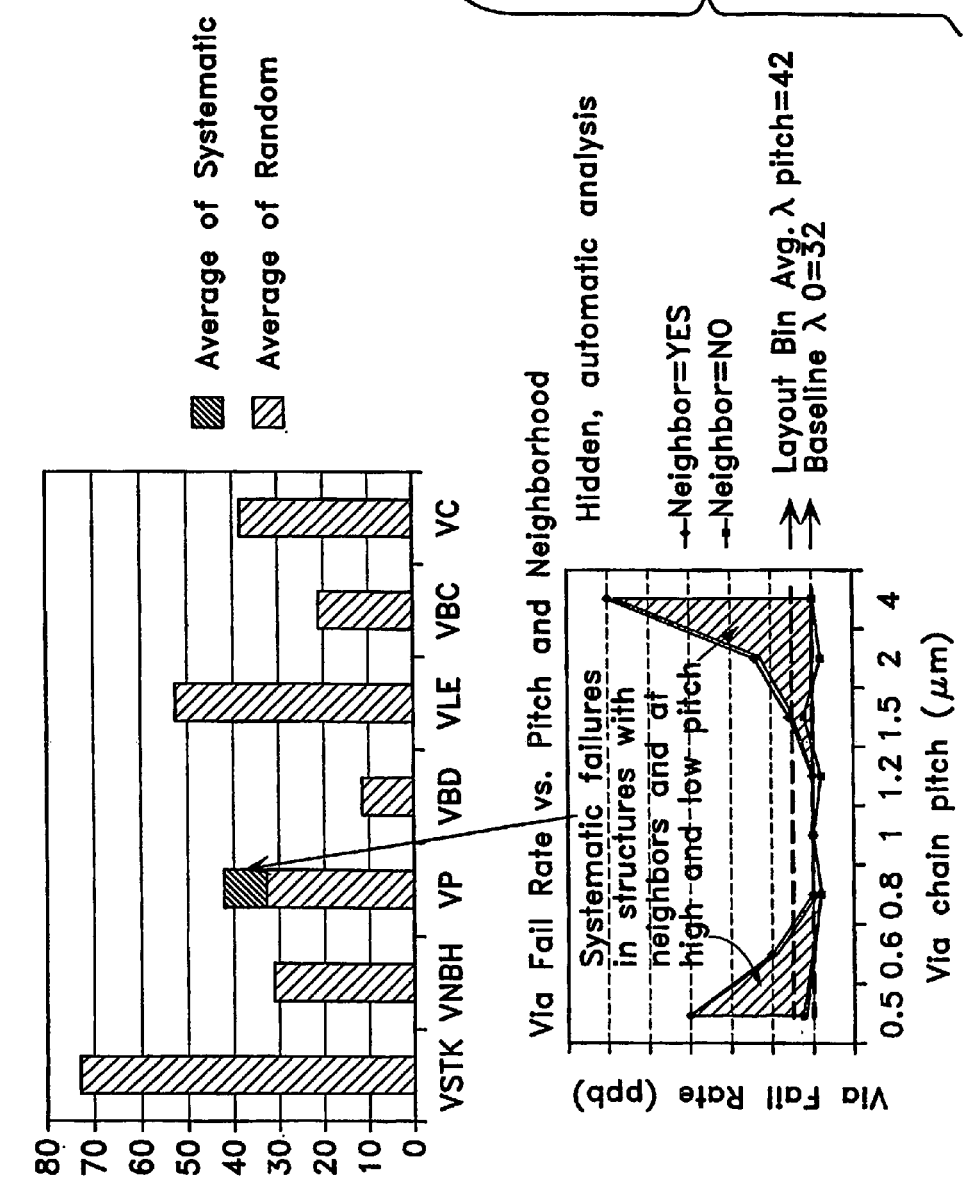

FIGS. 35, 36, and 37 depict exemplary plots of failure rate vs. layout bins;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

I. Overview

With reference to FIG. 1, in one exemplary embodiment, a process of localizing defects on a test chip is depicted. As will be described below in greater detail, a test chip includes a plurality of test structures, which are designed to simulate failure modes that may result in fabricating an integrated circuit of an actual product chip.

In block 102, a test chip is fabricated on a test wafer. The test chip includes a plurality of test structures and probe pads. A test structure is electrically connected to one or more probe pads, which are used to electrically test the test structure.

In one exemplary embodiment, the test structures of the test chip are configured for parallel electrical testing. More specifically, test structures are grouped together as one or more padgroups. The test structures in a padgroup are electrically tested in parallel, meaning that the test structures are electrically tested together at approximately the same time.

In another exemplary embodiment, the test structures of the test chip are configured for localization of defects. More specifically, if a test structure on a test chip is fabricated with a defect that results in the test structure failing the electrical test performed on the test structure, the location of the test structure with the defect within the test chip is obtained.

In block 104, the test structures on the test chip are electrically tested in parallel. In one exemplary embodiment, the test structures in a padgroup are electrically tested in parallel, meaning that they are electrically tested together at approximately the same time. Additionally, multiple padgroups can be electrically tested in parallel. Thus, in this manner, the amount of time required to electrically test the test structures on the test chip may be reduced.

In block 106, the results of the electrical test performed on the fabricated test chips are analyzed. More specifically, a test structure that fails the electrical test is assumed to have been fabricated with a defect. Thus, the electrical test detects defects on the test chip. In one exemplary embodiment, the detected defects are classified as random or systematic defects. Additionally, in one exemplary embodiment, when a test structure with a defect is identified, the location of the test structure within the test chip is obtained.

It should be noted that the exemplary process described above and depicted in FIG. 1 can include various additional steps. For example, with reference to FIG. 2, in one alternative embodiment, in block 202, the fabricated chip can be in-line inspected. More specifically, the fabricated chip can be in-line inspected using an optical inspection tool, such as a microscope, to visually detect any defects on the fabricated test chip and to determine the location of the defects. As depicted in FIG. 2, the results of the analysis performed in block 106 can be used as a feedback to the in-line inspection performed in block 202.

With reference to FIG. 3, in another alternative embodiment, in block 302, the results of the analysis performed in block 106 can be used to inspect the defects using an inspection tool, such as an optical inspection tool, a defect review scanning electron microscope (DR-SEM), a wafer inspection scanning electron microscope (SEM), and the like. More specifically, the results of the electrical test can localize (i.e., identify the location of) the test structure with a defect within the test chip. The inspection tool can then inspect the test structure to localize the defect to a specific location within the test structure. The inspection tool can also obtain an image of the defect, which can then be used to further analyze the defect, such as measuring the size of the defect, classifying the defect, and identifying a potential cause of the defect. It should be recognized that block 202 can be omitted from the present exemplary embodiment.

In this alternative embodiment, the test chip is adapted for use with the inspection tool. More specifically, the test structures on the test chip are sized to be compatible with the capabilities of an inspection tool, such as the view field of the inspection tool, which determines the area that can be inspected at one time, and the resolution of the inspection tool, which determines the amount of detail that can be obtained. For example, when a test structure is larger than the view field, the inspection tool may need to scan the test structure in order to locate (i.e., localize) a defect within the test structure. When a test structure is smaller than the view field, the level of detail that is provided by the inspection tool may be reduced.

With reference to FIG. 4, an exemplary system of localizing defects on a test chip is depicted. More specifically, in one exemplary embodiment, a defect localization system 400 includes a fabrication facility 404, an in-line inspection tool 406, a parallel electrical tester 408, a processor 410, and an inspection tool 412.

In the present exemplary embodiment, a test wafer 402 with one or more test chips is fabricated in fabrication facility 404. The test wafer 402 is in-line inspected using in-line inspection tool 406. The test wafer 402 is parallel electrically tested using parallel electrical tester 408. The results of the electrical test can be analyzed using processor 410. It should be recognized that processor 410 can be a component of parallel electrical tester 408 or a separate unit. The test wafer 402 is inspected using inspection tool 412.

It should be recognized that system 400 can include additional elements or fewer elements. For example, in-line inspection tool 406 can be omitted from system 400. Alternatively and/or additionally, inspection tool 412 can be omitted from system 400.

II. Test Chip

A test chip is used to characterize integrated circuit layout and manufacturing process interactions of an actual product chip. As described above, a test chip is designed to simulate the same failure modes as an actual product chip.

More specifically, as conceptualized in FIG. 5, an actual product chip 502 can have a plurality of design pattern variations. For example, one design pattern variation can include lines of a certain line width. As depicted in FIG. 5, the design pattern variations can include a number of core design pattern variations 504. A test chip 506 can be designed to include these core design pattern variations. Test chip 506 is easier to inspect, test, and analysis than actual product chip 502. In the context of the present description, the design pattern variations on a test chip are referred to as experiments. Additionally, a test chip can also be referred to as a CHARACTERIZATION VEHICLE, which is a trademark of PDF Solutions of San Jose, Calif. USA.

The following table lists exemplary test structures:

| Name | Description | Comments |
| --- | --- | --- |
| Via Chain without Neighborhood | Vertical or horizontal snaking chain of M1, M2 links connected by vias | May be wired out in "long runner" configuration |
| Via Chain with Neighborhood | Vertical or horizontal snaking chain of M1, M2 links connected by vias | |
| 1-D SnakeComb BigCell | Vertical or horizontal metal lines arranged in a "grating." Edge hookups create snake between two interleaved combs | May have either parallel or perpendicular patterns in underlayer |
| 1-D SnakeComb with SubCells | Vertical or horizontal metal lines arranged in a "grating." Edge hookups create snake between two interleaved combs. Many such SnakeComb "sub cells" arranged in an array | May have either parallel or perpendicular patterns in underlayer |

-continued

| Name | Description | Comments |
| --- | --- | --- |
| Snake | Vertical or horizontal metal lines arranged in a "grating." Edge hookups create a pure snake | May have either parallel or perpendicular patterns in underlayer |
| 1-D Comb | Vertical or horizontal metal lines arranged in a "grating." Edge hookups create two interleaved combs. Important area is long lines and line ends may be relaxed | May have either parallel or perpendicular patterns in underlayer |
| 2-D Comb | Like many 1-D combs appended vertically or horizontally. Important area is line end rather than long line | Nearly identical patterns in underlayer |

It should be recognized, however, that the types and numbers of test structures on a test chip may vary.

Figures 6, 6A:
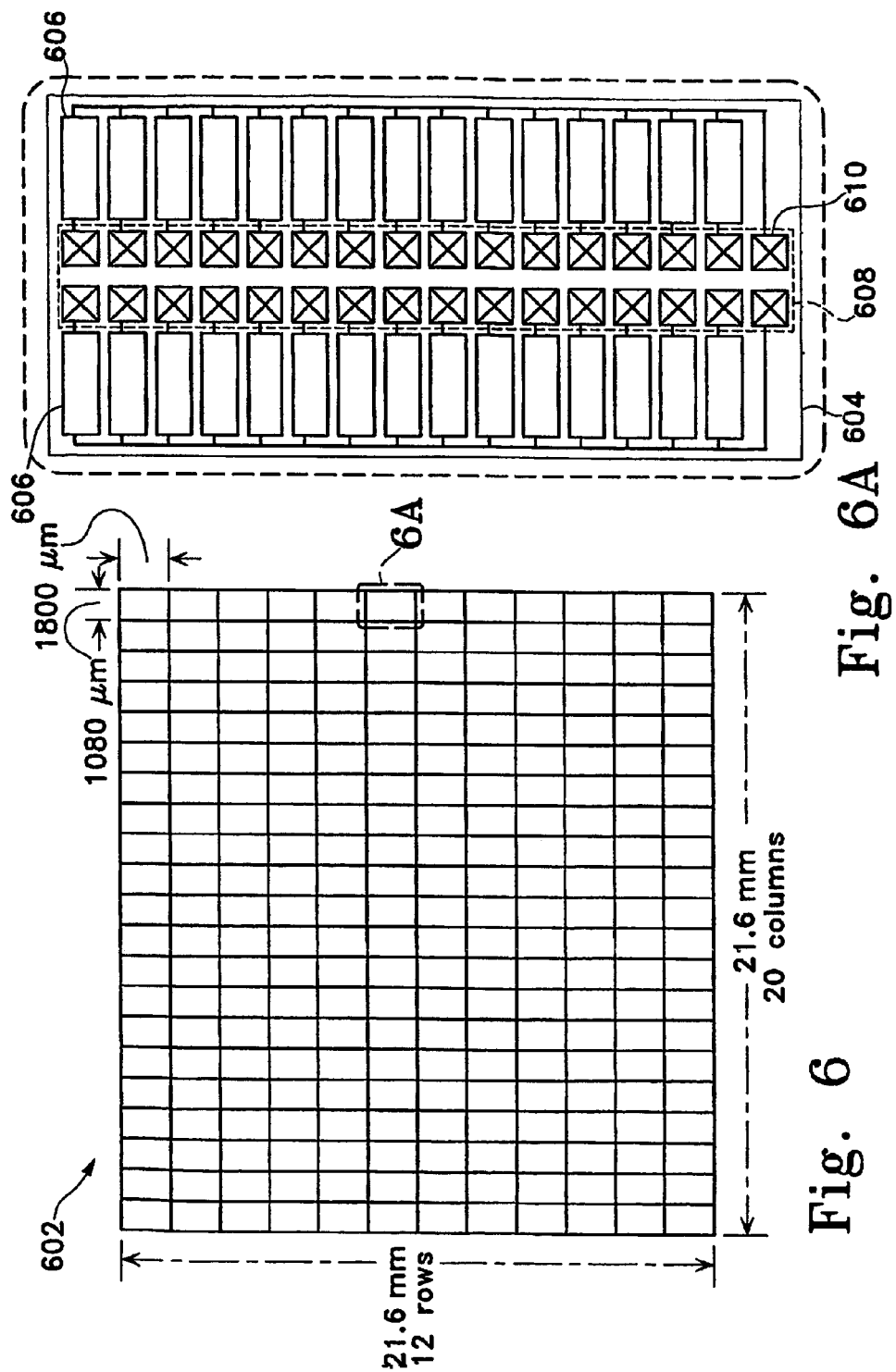
FIG. 6 depicts an exemplary layout of a test chip.

As described above, in one exemplary embodiment, the test structures of a test chip are configured for parallel electrical testing. With reference to FIG. 6, an exemplary layout 602 of a test chip is depicted. Layout 602 includes a plurality of padgroups 604 arranged in rows and columns. More specifically, FIG. 6 depicts 240 padgroups arranged in 12 rows and 20 columns. It should be noted, however, that any number of padgroups may be arranged in any number of rows and columns. Additionally, FIG. 6 depicts padgroups having a width of 1080 microns and a height of 1800 microns. It should be noted, however, that a padgroup may have any width and height.

As further depicted in FIG. 6, a padgroup 604 includes a plurality of test structures 606 and a padframe 608 with electrical probe pads 610 for the test structures 606 within padgroup 604. More specifically, padgroup 604 includes padframe 608 disposed between two columns of test structures 606 within padgroup 604.

As described above, in one exemplary embodiment, the test structures within a padgroup are electrically tested in parallel, meaning that the test structures within the padgroup are electrically tested together at approximately the same time. Thus, in padgroup 604 depicted in FIG. 6, test structures 606 within padgroup 604 are electrically tested together. Additionally, multiple padgroups 604 may be electrically tested together. For example, in one exemplary embodiment, six padgroups 604 are electrically tested together at one time.

Test structures 606 are electrically tested using a parallel tester that has a plurality of test probes that make electrical contact with probe pads 610 within padframe 608. More specifically, for padgroup 604 in FIG. 6, 32 test probes contact the 32 probe pads in padframe 608 to electrically test the 30 test structures in padgroup 604 in parallel.

The arrangement of probe pads for test structures within a padgroup into a padframe for the padgroup facilitates parallel testing of the test structures. Additionally, locating probe pads adjacent to test structures reduces the length of the interconnection lines between the probe pads and the test structures.

By parallel testing the test structures, the size of the test structures can be decreased and/or the number of test structures on a test chip can be increased without necessarily increasing the overall time to electrically test the test chip. In turn, by decreasing the size of the test structures, a defect on the test chip can be located to a more specific location (i.e., localized) on the test chip. Additionally, in an exemplary embodiment when an inspection tool is used, the test structures can be sized to be compatible with the capabilities of the inspection tool, such as the view field and resolution of the inspection tool.

In FIG. 6, a padgroup 604 is depicted with test structures 606 that are two-terminal test structures (e.g., via chains, via combs, metal snakes, metal combs, and the like). Additionally, in FIG. 6, test structures 606 have one common terminal. In one exemplary embodiment, the common terminal can be grounded to the substrate.

Figure 7:
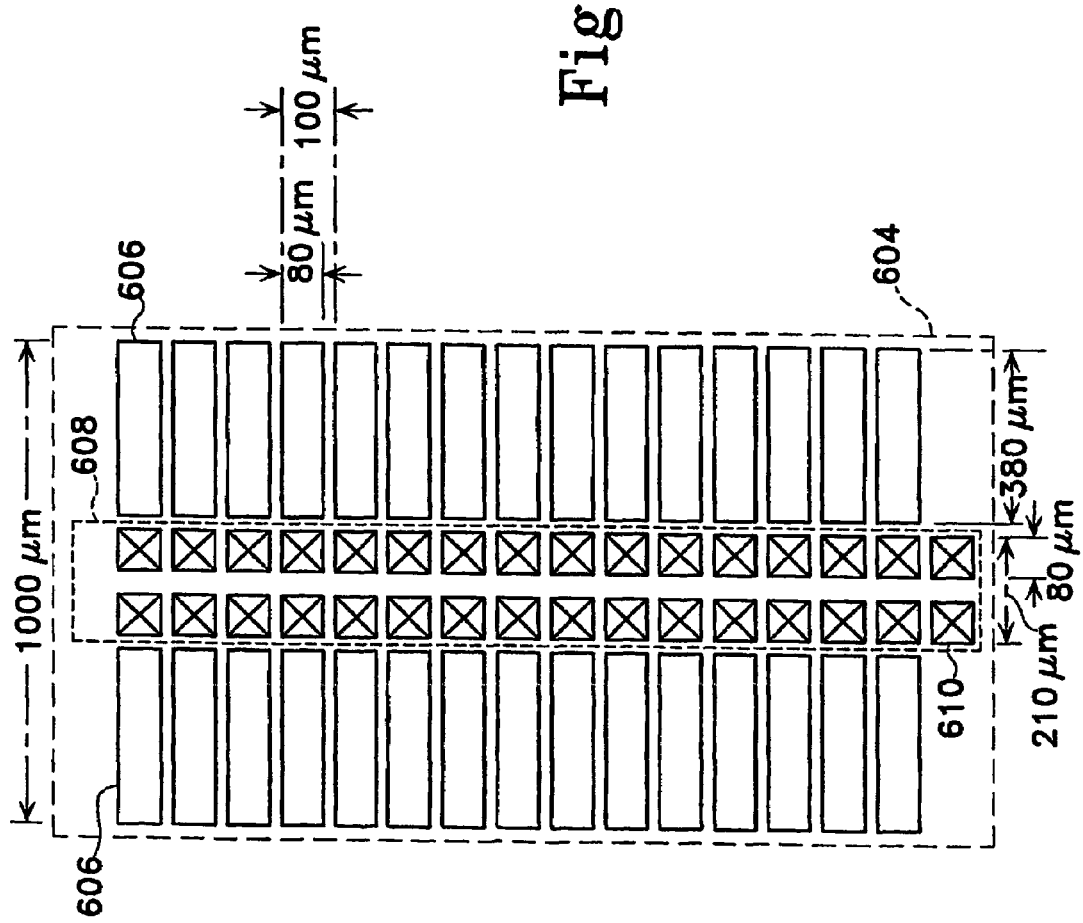
FIG. 7 depicts an exemplary padgroup.

FIG. 7 provides exemplary dimensions of test structures 606 and padframe 608 of padgroup 604 having 28 or 30 two-terminal test structures or devices under test (DUT's). In the present exemplary embodiment, for padframe 608, the pad size is 80 microns. The pad pitch in the vertical direction (Ypitch) is 100 microns. The pad pitch in the horizontal direction (Xpitch) is 130 microns. The width is 210 microns. The height is 1580 microns. For test structure 606, the height is 80 microns, and the width is 380 microns. The test structure types are snakes, combs, or any other two-terminal devices. The pads at the bottom of the columns are common nodes. The next row of pads may be used for neighborhood metals connections (to check for shorts to neighborhood). There are 30 DUTs per padgroup. It should be recognized, however, that these dimensions may vary.

Figure 8:
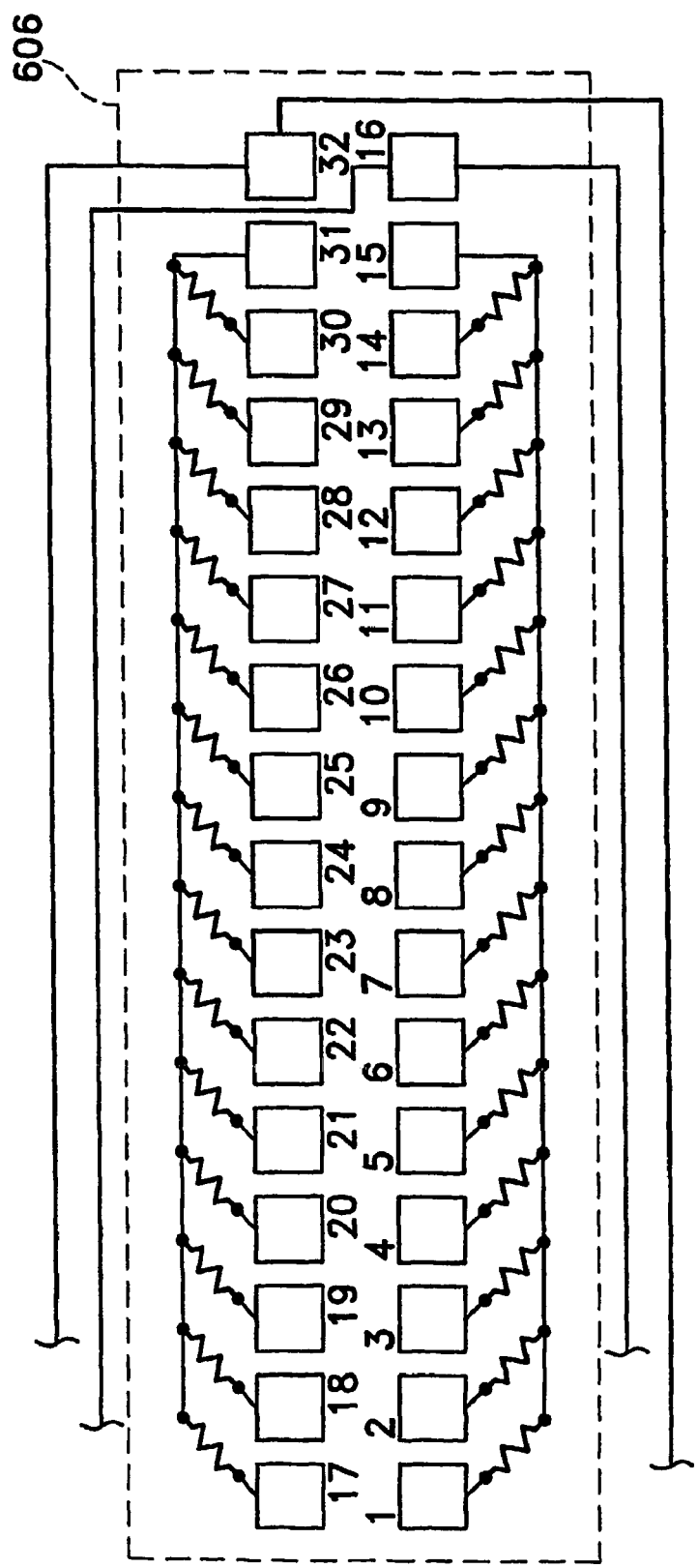
FIGS. 8 and 9 depict exemplary test structures.
Figure 9:
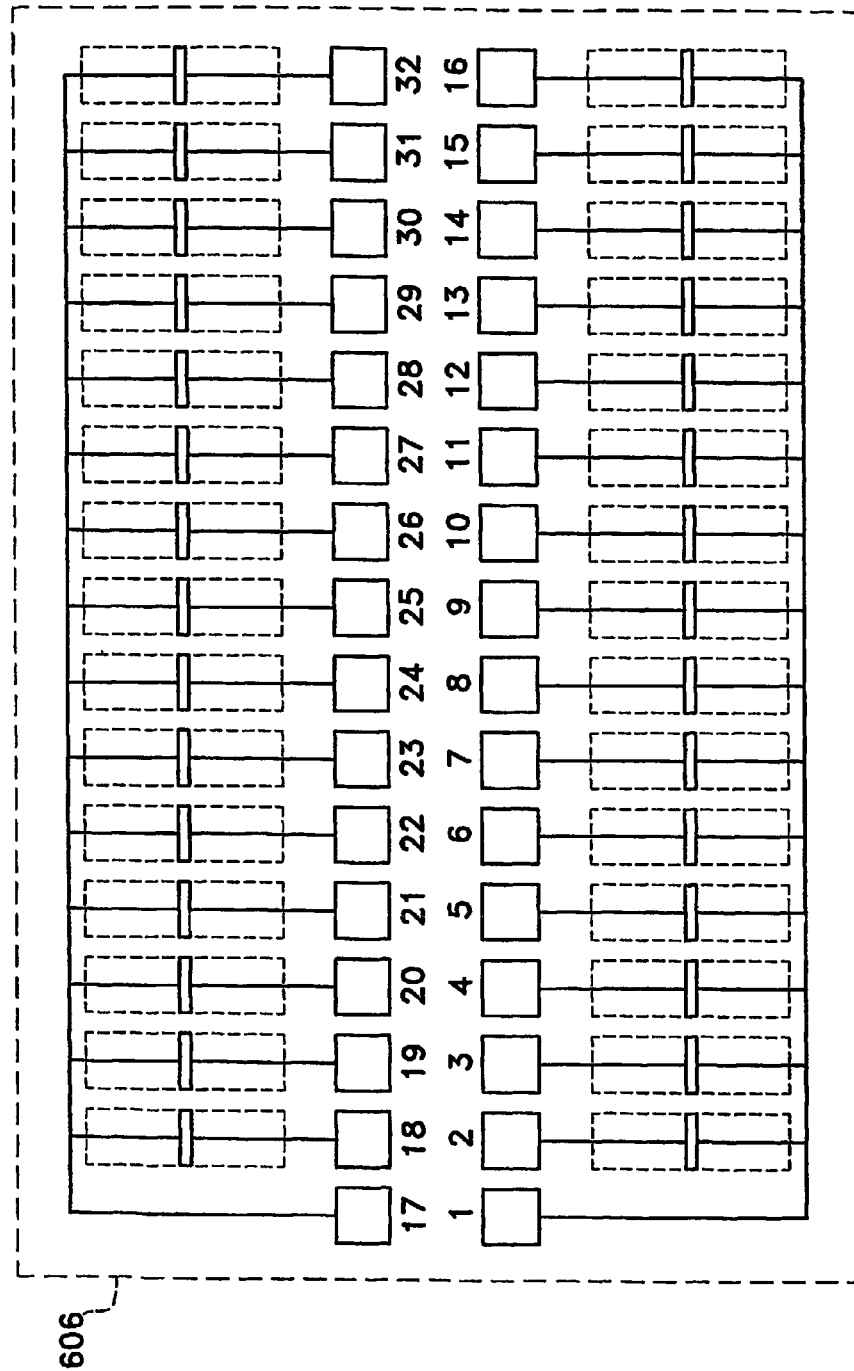

In FIG. 8, test structures 606 in padgroup 604 of FIG. 7 are depicted as being configured as 28 via chains. Alternatively, in FIG. 9, test structures 606 in padgroup 604 of FIG. 7 are depicted as 30 comb cells.

It should be recognized, however, that test structures 606 in padgroup 604 of FIG. 7 can be configured as various two-terminal test structures. Additionally, it should be recognized that a padgroup 604 can include test structures having any number of terminals.

Figure 10:
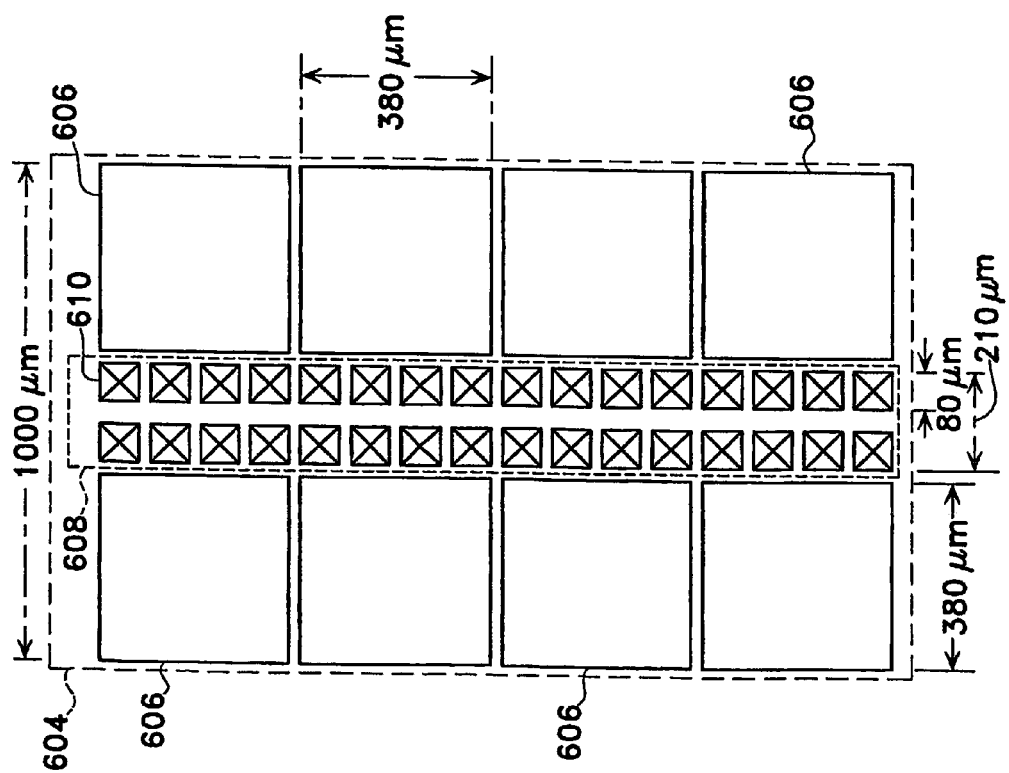
FIG. 10 depicts another exemplary padgroup.

For example, in FIG. 10, a padgroup 604 is depicted with eight test structures 606 that are four-terminal test structures or devices under test (DUT's). It should be noted, however, that padgroup 604 can include any number of four-terminal test structures. In the present exemplary embodiment, for padframe 608, the pad size is 80 microns. The pad pitch in the vertical direction (Ypitch) is 100 microns. The pad pitch in the horizontal direction (Xpitch) is 130 microns. The width is 210 microns. The height is 1580 microns. For test structure 606, the height is 380 microns, and the width is 380 microns. The test structure types are snakecombs or any other four-terminal devices. There are eight DUTs per padgroup. It should be recognized, however, that these dimensions can vary.

In FIG. 11, test structures 606 in padgroup 604 of FIG. 10 are depicted as being configured as eight snakecomb cells. In one exemplary embodiment, each snakecomb cells depicted in FIG. 11 is configured to permit localization of a defect in a snakecomb cell to a location within the snakecomb cell.

More specifically, with reference to FIG. 12-A, assume a snakecomb cell 1202 has terminals N, C, and G. With reference to FIG. 12-B, assume now that snakecomb cell 1202 has a defect 1204. With reference to FIG. 12-C, assume that the snake comb with the defect depicted in FIG. 12-C can be characterized by electric circuit 1206.

In one exemplary embodiment, the following electrical test can be performed:
$R_{gn}$=force 1V at G, terminate at N, measure resistance GN
$R_{gc}$=force 1V at G, terminate at C, measure resistance GC
$R_{nc}$=force 1V at N, terminate at C, measure resistance NC where A, B, and D are calculated as follows:

$$D = \frac{R_{gc} - (R_{gn} - R_{nc})}{2}$$
$$B = R_{gc} - D$$
$$A = R_{gn} - B$$

and:
shortPerc (position of defect on Snake vs. Grounded side of Snake $$(G)) = \frac{A}{R_{gn}}.$$

Alternative, assume the following electric tests are performed:
$R_{gn}$=force 1V at G, terminate at N, measure resistance GN
$R_{gc}$=force 1V at G, terminate at C, measure resistance GC
$R_{ngc}$=force 1V at N, terminate at C, measure resistance NC ($R_{ngc}$ differs from the previous measurement method because it forces 1V at both G and N to cut off a sneak path between the G terminals of multiple snakecombs in the same padgroup.) where A, B, and D are calculated as follows:

$$X = \frac{R_{gn} - (R_{gc} - R_{ngc})}{2}$$
$$B = \sqrt{(R_{gn})^2 - R_{gn}X}$$
$$A = R_{gn} - B$$

and:
shortPerc (position of defect on Snake vs. Grounded side of Snake $$(G)) = \frac{A}{R_{gn}}.$$

In one exemplary embodiment, a soft short is detected by comparing a line resistance, which can be determined based on a measured voltage, to a threshold resistance. If the line resistance is below the threshold voltage, then a soft short is detected. A hard short is also detected by comparing a line resistance to a threshold resistance. However, the threshold resistance used to detect a soft short is greater than the threshold resistance used to detect a hard short.

Additionally, in another exemplary embodiment, a soft short is detected by determining an average resistance for a number of lines that are adjacent to each other, such as those within the same padgroup. If a particular line has a resistance less than the average resistance by a specified amount, then a soft short is detected. A hard short is also detected by comparing a line resistance to the average resistance. However, the specified amount of difference between the resistance of a line with a soft short and the average resistance is less than the difference between the resistance of a line with a hard short and the average resistance.

In FIG. 13, another padgroup 604 is depicted with eight test structures 606 that are four-terminal test structures or devices under test (DUT's). In contrast to padgroup 604 depicted in FIG. 10, padgroup 604 depicted in FIG. 13, 4 test structures 606 are formed in one layer and four test structures 606 are formed on another layer. In the present exemplary embodiment, for padframe 608, the pad size is 80 microns. The pad pitch in the vertical direction (Ypitch) is 100 microns. The pad pitch in the horizontal direction (Xpitch) is 130 microns. The width is 210 microns. The height is 1580 microns. For test structure 606, the height is 760 microns, and the width is 380 microns. The test structure types are snakecombs or any other four-terminal devices. There are eight DUTs per padgroup with 4 in each layer. Padgroup 604 has the same schematic as padgroup 604 in FIG. 10. It should be recognized, however, that these dimensions may vary. Additionally, it should be recognized that test structure can be formed on any number of metal layers, where the test structure below another test structures in another layer can be tested, and the interaction of test structures at two or levels can be measured.

Figure 14:
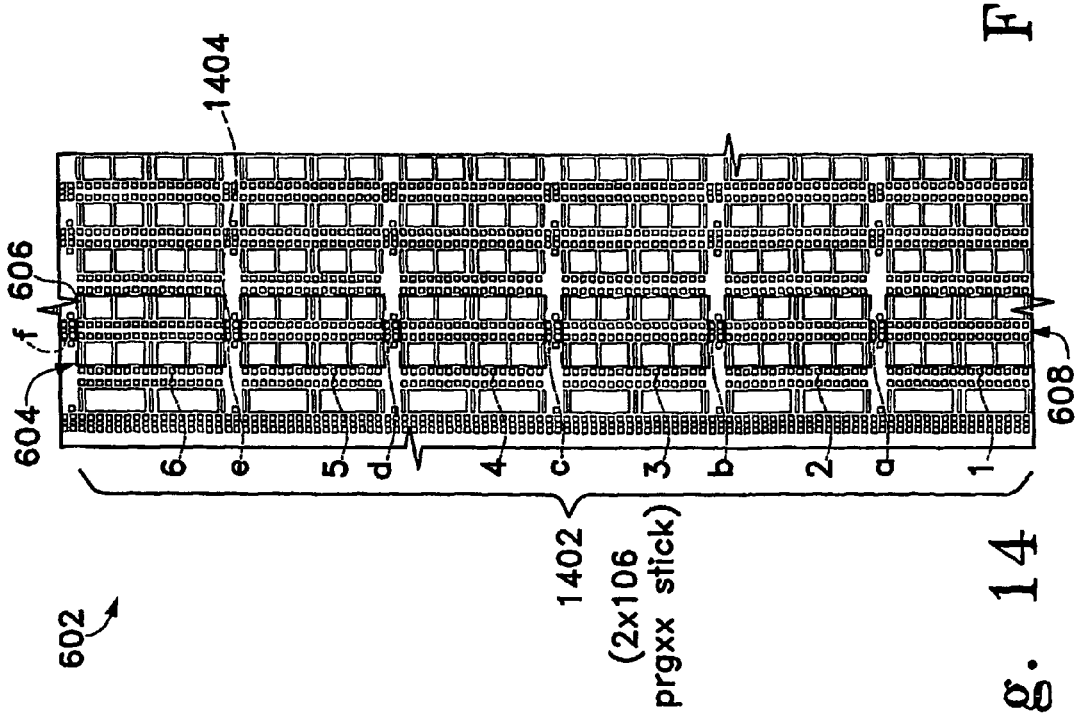

In FIG. 14, a portion of an exemplary layout 602 is depicted with a plurality of padgroups 604 arranged in rows and columns. As described above, in one exemplary embodiment, six padgroups 604 can be electrically tested together at one time. In the exemplary embodiment depicted in FIG. 14, a stick 1402 labeled as "2×106 prgxx stick" in FIG. 14 includes padgroups 604 labeled as 1, 2, 3, 4, 5, and 6. In the present exemplary embodiment, padgroups 604 in stick 1402 are electrically tested together with a probe card from a parallel electrical tester.

As depicted in FIG. 14, in the present exemplary embodiment, each padgroup 604 includes eight test structures 606. Each padgroup 604 also includes four pads for each test structure 606. Thus, the padframe for each padgroup 604 includes a total of 32 pads.

As also depicted in FIG. 14, layout 602 also includes five minipadchk cells 1404 disposed between padsgroups 604 at locations labeled a, b, c, d, and e. As will be described in more detail below, each minipadchk cell 1404 includes two test structures with four pads, which are arranged as a 2×2 padframe.

Thus, stick 1402 includes a total of 212 pads ((32 pads/padgroup×8 padgroups)+(4 pads/minipadchk cell×5 minipadchk cells)). As depicted in FIG. 14, the 212 pads are arranged in two adjacent columns. Thus, the padframe for stick 1402, which includes the padframe from padgroups 604 and the pads from minipadchk cell 1404, is a 2×106 padframe. In the present exemplary embodiment, the padframe width is 210 microns.

In the present exemplary embodiment, stick 1402 is referenced using two parameters (prgName and prgRow). The progName parameter uniquely identifies each stick 1402 in layout 602, and the progRow parameter uniquely identifies each padgroup 604 within a stick 1402. More particularly, the parameter prgxxx is used to refer to a stick 1402. For a layout with one or two metal layers (i.e., M1/M2), two digits are used (e.g., prgxx). For a layout with three metal layers (i.e., M3), three digits are used (e.g., prog3xx). In the present exemplary embodiment, the parameter prg00 is reserved for use as a continuity pad check stick. The progName and progRow parameters can be exported as a text file. It should be recognized that the use of these parameters is exemplary and that various parameters can be used to reference stick 1402 and the components within stick 1402.

Figure 15:
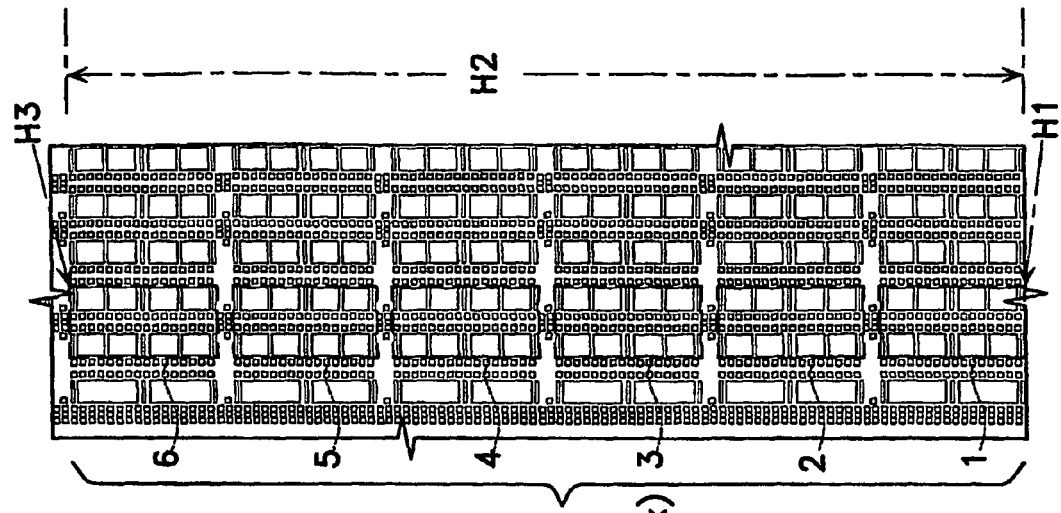

With reference to FIG. 15, in the present exemplary embodiment, stick 1402 has a floorplan height specification of 10.72 millimeters. More particularly, as depicted in FIG. 15, a height H1 includes spacing for bottom routing. A height H2 includes the overall height of the components within stick 1402. A height H3 includes spacing for labels and M3 virtual ground pads. In the present exemplary embodiment, H1, H2, and H3 are 15 microns, 10,580 microns, and 125 microns, respectively, for a total of 10,720 microns or 10.72 millimeters. It should be recognized that these dimensions are exemplary and that stick 1402 can have various floorplan height specifications.

With reference to FIG. 16, the top of height H1 is defined by the bottom edge of pads 16 and 32 of padgroup 604 labeled 1 in FIG. 14. The bottom of height H1 includes a buffer zone for butting another stick 1402 (FIG. 14). In one exemplary embodiment, the buffer zone is also required for VIA experiment routing. As described above, in one exemplary embodiment, height H1 is 15 microns.

With reference to FIG. 17, height H2 (FIG. 15) includes height H2a of padgroup 604. The top of height H2a is defined by the top edge of pads 1 and 17 of padgoup 604. The bottom of height H2a is defined by the bottom edge of pads 16 and 32 of padgroup 604. In the present exemplary embodiment, the pad size is 80 microns×80 microns. The pad pitch in the vertical direction (Ypitch) is 100 microns. The pad spacing in the vertical direction (Yspace) is 20 microns. Thus, height H2a is 1,580 microns ((16 pads×80 microns/pad)+(15 spacings×20 microns/spacing)).

Figures 18, 19:
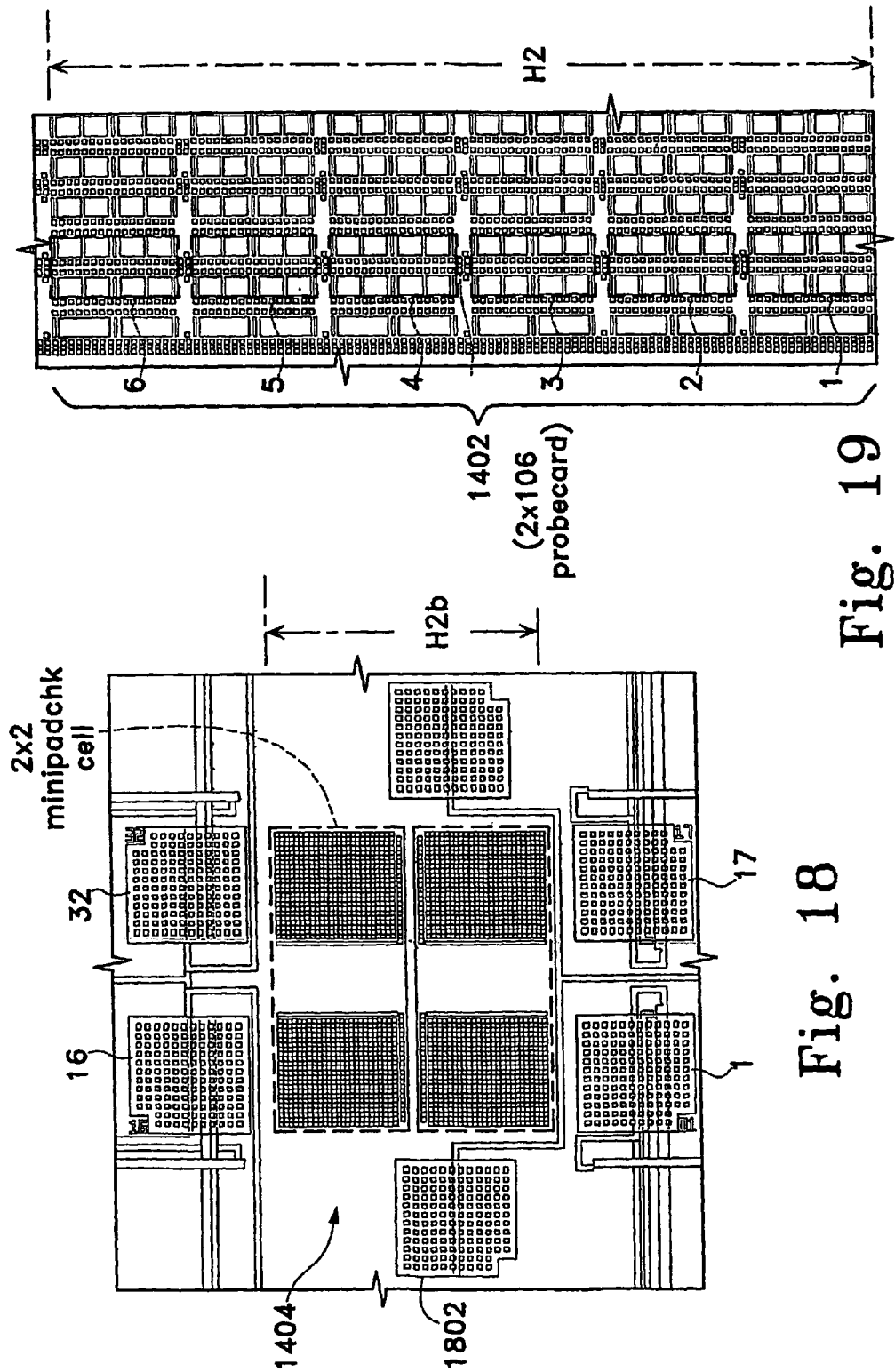

With reference to FIG. 18, height H2 (FIG. 15) also includes height H2b of minipadchk 1404. As described above and depicted in FIG. 18, minipadchk 1404 includes two test structures 1802 with four pads, which are arranged as a 2×2 padframe. In the present exemplary embodiment, test structures 1802 are used to verify the operation of the probe card and the associated test system. The top of height H2b is defined by the edge of pads 16 and 32 of the padgroup above minipadchk 1404. The bottom of height H2b is defined by the edge of pads 1 and 17 of the padgroup below minipadchk 1404. In the present exemplary embodiment, the pad size is 80 microns×80 microns. The pad pitch in the vertical direction (Ypitch) is 100 microns. The pad spacing in the vertical direction (Yspace) is 20 microns. Thus, height H2b is 220 microns ((2 pads×80 microns/pad)+(3 spacings×20 microns/spacing)).

With reference to FIG. 19, height H2 includes the dimensions of each padgroup (i.e., height H2a) and minipadchk (i.e., height H2b). The top of height H2 is defined by the top edge of pads 1 and 17 of the top padgroup labeled 6 in FIG. 19. The bottom edge of height H2 is defined by the bottom edge of pads 16 and 32 of the bottom padgroup labeled 1 in FIG. 19. In the present exemplary embodiment, the pad size is 80 microns×80 microns. The pad pitch in the vertical direction (Ypitch) is 100 microns. The pad spacing in the vertical direction (Yspace) is 20 microns. Thus, height H2 is 10,580 microns ((6 padgroups×1,580 micron/padgroup)+(5 minpadchk×220 microns/minipadchk)).

Figure 20:
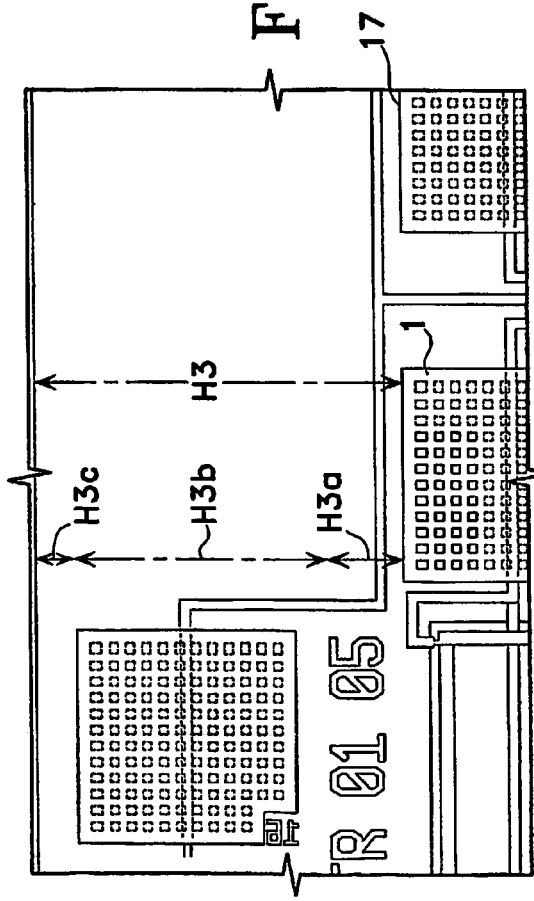

With reference to FIG. 20, height H3 includes height H3a, height H3b, and height H3c. The top of height H3 is defined by the bottom edge of the next metal structure. The bottom of height H3 is defined by the top edge of pads 1 and 17 of the top padgroup labeled 6 in FIG. 19.

The top of height H3a is defined by the top edge of the label. The bottom of height H3a is defined by the top edge of pads 1 and 17 of the top padgroup labeled 6 in FIG. 19. In one exemplary embodiment, the label height is 18 microns. The spacing from routing lines to the bottom of the label is 10 microns. In the present exemplary embodiment, height H3a is 28 microns.

The top of height H3b is defined by the top edge of the M3 virtual ground pad. The bottom of height H3b is defined by the top edge of the label. In one exemplary embodiment, the pad height is 80 microns. The space from the label top to the bottom of the M3 virtual ground pad is 14 microns. In the present exemplary embodiment, height H3b is 94 microns.

The top of height H3c is defined by the bottom edge of the next metal structure. The bottom of height H3c is defined by the top edge of the M3 virtual ground pad. Height H3c functions as a buffer zone. In the present exemplary embodiment, height H3c is 3 microns. Thus, height H3 is 125 microns (28 microns+94 microns+3 microns).

Figure 21:
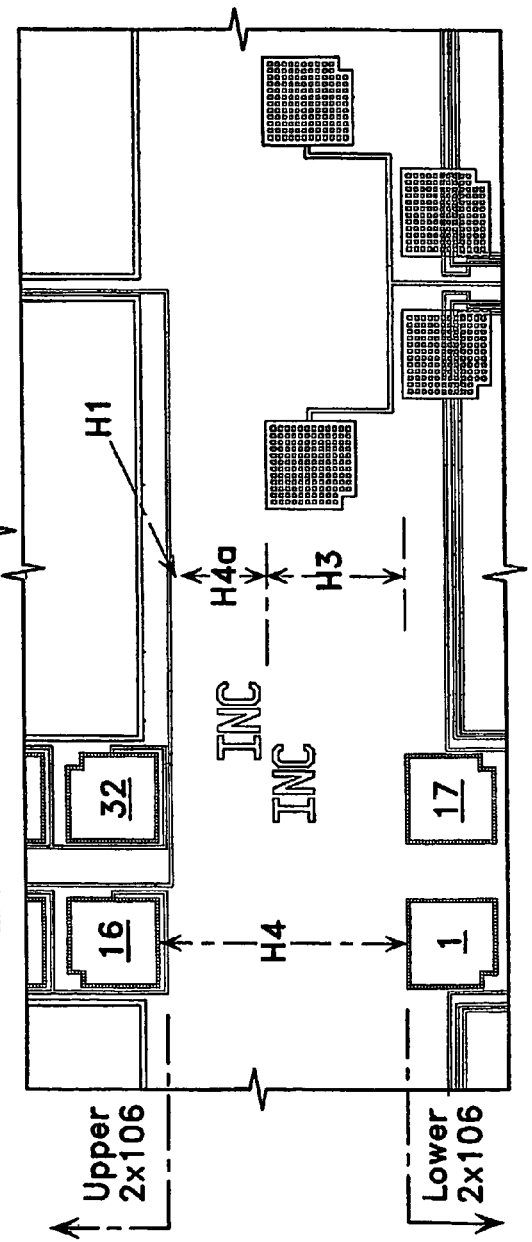

With reference to FIG. 21, in one exemplary embodiment, layout 602 (FIG. 14) includes a height H4 for stacking sticks 1402 (FIG. 14). The top of height H4 is defined by the bottom edge of pads 16 and 32 of the bottom padgroup in the upper stick in the stack. The bottom of height H4 is defined by the top edge of pads 1 and 17 of the top padgroup in the lower stick in the stack. In one exemplary embodiment, height H4 is sized to fit a minipadchk 1404 (FIG. 14), which allows for minipadchk 1404 (FIG. 14) to be included between the bottom padgroup in the top stick in the stack and the top padgroup in the lower stick in the stack. Thus, height H4 is equal to height H2a of 220 microns. Additionally, as depicted in FIG. 21, height H4a is the difference between height H4 and height H1 and H3 (i.e., H4−H1−H3), which is 80 microns.

With reference to FIG. 22, an exemplary layout 602 configured for deployment into a stepper square field is depicted. Layout 602 includes a stack of two sticks 1402 with height H4a between sticks 1402. Thus, in the present exemplary embodiment, the total field height of layout 602 is 21.52 millimeters (10.72 millimeters+0.08 millimeters+10.72 millimeters).

It should be recognized, however, that layout 602 can be configured for various dimensions. For example, layout 602 can be configured for deployment into a scanner rectangular field. A typical scanner field has a width (X) of 26 millimeters and a height (Y) of 32 millimeters. Thus, layout 602 can include a stack of three sticks 1402. In the present exemplary embodiment, the total field height would be 32.32 min ((10.72 millimeters/stick×3 sticks)+(0.08 millimeters/spacing×2 spacings)).

To better fit the height of a typical scanner field, various adjustments can be made to layout 602 to reduce overall height. For example, height H4a can be reduced from 80 microns to 10 microns. Thus, the total field height of layout 602 is reduced to 32.18 millimeters ((10.72 millimeters/stick×3)+(0.01 millimeters/spacing×2 spacings)).

Alternatively, with reference to FIG. 20, the M3 virtual ground pad can be redesigned into a rectangular shape having a width and height of 40 microns×160 microns, which reduces the height H3b from 94 microns to 45 microns. Height H3 is reduced to 76 microns, which reduces the height of a stick to 10.671 millimeters. Thus, with reference again to FIG. 22, the total field height of layout 602 is reduced to 32.033 millimeters ((10.671 millimeters/stick×3)+(0.08 millimeters/spacing×2 spacings)). The reduced size of the M3 virtual ground pad remains large enough for an SEM inspection tool, such as the SEMVision tool produced by Applied Materials, Inc. of Santa Clara, Calif., USA, to focus an electron beam to inspect/view the M3 virtual ground pad for defect localization.

As another alternative, four of the five minipadchks can be removed. More particularly, with reference to FIG. 14, the minipadchks labeled a, b, d, and e are removed, and only the minpadchk in the center, which is labeled c, is retained. Thus, height H2 is reduced to 9,700 microns, which reduces the height of a stick to 9.791 millimeters. Thus, with reference again to FIG. 22, the total field height of layout 602 is reduced to 29.393 millimeters ((9.791 millimeters/stick×3)+(0.01 millimeters/spacing×2 spacings)). Note that a different probe card is used to test this shorter stick.

It should be noted, however, that the various dimensions provided above are exemplary, and any one or more of these dimensions may be varied. Additionally, it should be recognized that the number of pads, test structures, padgroups, sticks, and levels can be varied.

III. Parallel Electrical Tester

As described above, the test structures within a padgroup are tested together using a parallel electrical tester. With reference to FIG. 23, an exemplary parallel electrical tester 2300 is depicted. In one exemplary embodiment, tester 2300 performs automated resistance measurement and leakage current measurements.

In the present exemplary embodiment, tester 2300 is designed to enable testing of structures within die on a wafer in less than one hour, which is a speedup of 10-20 times as compared to conventional parametric testing approaches. Tester 2300 also includes the following features:

- 256 identical, independent, parallel I/O channels, each with the following capabilities: voltage and resistance measurement, source voltage or source current, and programmable pin termination;
- Resistance measurement capability from 10 ohm to 100 Mohm;
- Cable-out interface to prober/prober tester interface (PTI) (8 cables with 32 signals/cable);
- Standard general purpose interface bus (GPIB) interface to compatible wafer probers;
- PC-based controller with Microsoft Windows 2000 Operating System;
- Emergency Off (EMO) switches with EMO daisy-chain connections on rear panel;
- Rolling casters for ease of movement;
- Leveling feet for secure tester installation; and
- Clean room compatible design.

It should be recognized that these features are exemplary, and that any one or more of these features can be omitted from tester 2300, or any one or more additional features can be included in tester 2300.

As depicted in FIGS. 23 and 24, tester 2300 includes a monitor 2302, a keyboard 2304, a measurement control (MC) unit 2306, casters 2308, and EMO 2310. MC unit 2306 includes a pin termination module 2314, a fan tray 2316, a data acquisition (DAQ) module 2318, and a tester control module 2320. DAQ module 2318 includes digital I/O pin termination control, current/voltage sources, and voltage measurement units. It should be recognized, however, that tester 2300, MC unit 2306, and DAQ module 2318 can include fewer or additional components.

With reference to FIGS. 25 and 26, an exemplary wafer tester system 2500 is depicted. In one exemplary embodiment, tester system 2500 includes parallel electrical tester 2300, wafer prober 2502, and wafer loader 2504. As depicted in FIGS. 25 and 26, tester 2300 is connected to a prober tester interface (PTI) 2506 on wafer prober 2502 using cables 2508. In the present exemplary embodiment, cables 2508 are preferably 1.8 meters long and connected to the upper rear panel of MC unit 2306 (FIG. 23). As depicted in FIGS. 25 and 26, tester 2300 is preferably positioned close enough to wafer prober 2502 to reduce strain on cables 2508. Ideally, as depicted in FIGS. 25 and 26, tester 2300 is immediately adjacent to wafer prober 2502. Wafer loader 2504 includes one or more front opening unified pods (FOUPs) to process multiple wafers through wafer prober 2502.

With reference to FIG. 27, a system block diagram is depicted of tester system 2500. As depicted in FIG. 27, wafer prober 2502 includes an auto-loader 2704 to receive a test wafer 2702 from wafer loader 2504 (FIGS. 25 and 26). Wafer prober 2502 also includes a probe card 2706 to electrically contact test wafer 2702. More particularly, in the present exemplary embodiment, probe card 2706 includes 256 pins. Thus, the 212 pads in stick 1402 (FIG. 14) can be electrically tested in parallel at one time using probe card 2706.

In the present exemplary embodiment, wafer prober 2502 is controlled by tester control module 2320 through GPIB interface 2708. More particularly, tester control module 2320 issues commands to wafer prober 2502, such as commands to position probe card 2706, lift probe card 2706 off of a stick, move to a new position, and descend to make contact with another stick.

As depicted in FIG. 27, in the present exemplary embodiment, test signals are transmitted between probe card 2706 and pin termination module 2314 through a signal bus 2716. In the present exemplary embodiment, signal bus 2716 is an 8×32 signal bus. The test signals are also transmitted between termination module 2314 and multiplexer module 2710 through signal bus 2716. The test signals are then transmitted from multiplexer module 2710 to DAQ module 2318.

As also depicted in FIG. 27, MC unit 2306 sends digital control signals to pin termination module 2314 through a digital I/O (DIGIO) 2712. MC unit 2306 also includes analog voltage sources for pin termination module 2314. Additionally, MC unit 2306 and tester control module 2320 are connected using a peripheral component interconnect (PCI) bridge 2714.

With reference to FIG. 28, a system block diagram of a portion of termination module 2314 (FIG. 27) is depicted. As depicted in FIG. 28, termination module 2314 (FIG. 27) includes a plurality of switch cards 2802, which receive test signals from probe card 2706. In the present exemplary embodiment, termination module 2317 (FIG. 27) includes 8 switch cards 2802, where each switch card can be connected to as many as 32 pins from probe card 2706. More particularly, as depicted in FIG. 28, pins 1-32 from probe card 2706 are connected to a first switch card 2802 (labeled PT1 in FIG. 28), subsequent groups of 32 pins are connected to subsequent switch cards 2802, and then pins 225-256 are connected to an eighth switch card 2802 (labeled PT8 in FIG. 28).

As also depicted in FIG. 28, each switch card 2802 is connected to DIGIO 2712 (FIG. 27) and voltage sources in MC unit 2306 (FIG. 27). More particularly, each switch card 2802 is connected to 16 DIGIO lines and 2 voltage sources.

In the present exemplary embodiment, one function of termination module 2314 (FIG. 27), and more particularly switch card 2802, is to form a resistor divider with the resisters in the device under test (DUT), selectable on-board termination resistor, and software-controlled analog voltage sources. More particularly, with reference to FIG. 29, an exemplary circuit diagram is depicted. As depicted in FIG. 29, a resistor divider is formed with the resistor R in the DUT, the termination resistor $R_T$, and the analog voltage source $V_s$. Thus, the resistance of the DUT can be determined from voltage measures $V_M$. Note that the DUT current (IDUT) is equal to $V_M/V_T$, the DUT voltage is equal to $V_S-V_M$, and the DUT resistance ($R_{DUT}$) is equal to $V_{DUT}/I_{DUT}$. Additionally, in the present exemplary embodiment, resisters $R_W$ are only used for error calculations of absolute R value.

With reference to FIG. 30, an exemplary circuit diagram of a two point resistance measurement implementation is depicted. As depicted in FIG. 30, a first voltage source (V1) is provided on channel i and a second voltage source (V2) is provided on channel j. The DUT resistance can then be determined based on the two source voltages and the termination resistance Rt.

With reference to FIG. 31, a system block diagram of a portion of switch card 2802 (FIG. 28) is depicted. As depicted in FIG. 31, switch card 2802 (FIG. 28) includes a plurality of pin terminator circuits 3102. In the present exemplary embodiment, each switch card 2802 (FIG. 28) includes 32 pin terminator circuits 3102, where each pin terminator circuit 3102 is connected to a pin from probe card 2706.

As also depicted in FIG. 31, switch card 2802 (FIG. 28) includes a plurality of digital multiplexer (MUX) controls 3104. In the present exemplary embodiment, each switch card 2802 (FIG. 28) includes 16 digital MUX controls 3104, where each digital MUX control 3104 is connected to two pin terminator circuits 3102 and provide eight control signals to each pin terminator circuits 3102.

With reference to FIG. 32, a circuit diagram of a portion of pin terminator circuit 3102 (FIG. 31) is depicted. As depicted in FIG. 32, pin terminator circuit 3102 (FIG. 31) includes a plurality of quad switches 3202. In the present exemplary embodiment, each terminator circuit 3102 (FIG. 31) includes two quad switches 3202, where each quad switch 3202 is connected to a source voltage and four control signals. Thus, quad switches 3202 can connect the pin connected to pin terminator circuit 3102 (FIG. 31) to any of the source voltages and control signals.

With reference to FIG. 33, a system block diagram of MC unit 2306 is depicted. As described above, MC unit 2306 includes multiplexer module 2710 (FIG. 27), which receives test signals from probe card 2706 (FIG. 27). In the present exemplary embodiment, multiplexer module 2710 (FIG. 27) includes a plurality of multiplexer cards 3302 to combine the test signals received from probe card 2706 (FIG. 27). More particularly, as depicted in FIG. 28, each multiplexer card 3302 is a 32-to-1 analog multiplexer card that combines 32 channels received from probe card 2706 (FIG. 27) into one DAQ channel. In the present exemplary embodiment, eight multiplexer cards 3302 are used to combine the 256 test signals into eight DAQ channels, which are transmitted to an eight channel DAQ card 3304, which converts analog input to 16 bit digital measurements. In the present exemplary embodiment, DAQ card 3304 uses only one of the eight DAQ channels at a time.

As depicted in FIG. 33, multiplexer cards 3302 are connected to a signal conditional extensions for instrumentation (SCXI) bus 3306. DAQ card 3304 is connected to a PCI bus 3308. SCXI bus 3306 and PCI bus 3308 are connected to a local bus 3310.

As also depicted in FIG. 33, MC unit 2306 includes a digital I/O card 3312 with DIGIO 2712 to send control signals to pin termination unit 2314 (FIG. 27). More particularly, digital I/O card 3312 generates address, data, and control signals used to configure pin termination unit 2314 (FIG. 27). The address and data are decoded by termination unit 2314 (FIG. 27) to select a termination resistor, voltage source, ground, or open circuit for each probe pin on probe card 2706 (FIG. 27).

MC unit 2306 also includes PCI bridge 2714 and a voltage source 3314, which outputs 16 voltage sources to pin termination unit 2314 (FIG. 27) using a VSX 3316. PCI bridge 2714 and voltage source 3314 are both connected to PCI bus 3308.

IV. Analysis

The results of the electrical test can be analyzed to identify the location of (i.e., localize) any defects. More specifically, the location of a test structure failing the electrical test is determined based on the results of the electrical test. The results of the electrical test also can be analyzed to classify detected defects as random or systematic defects. Furthermore, the results can be analyzed to determine, model, or predict a yield.

With reference to FIG. 34, an exemplary process of defect analysis is depicted. In the present exemplary process, test chip design patterns 3402 are grouped into layout bins (e.g., bins 1-9 as depicted in FIG. 34). As depicted in FIG. 34, the test chip is fabricated and electrically tested (3404). Failure counts for each layout bin are then plotted (3406).

With reference to FIG. 35, an exemplary plot of failure rate vs. layout bins (e.g., VSTK, VNBH, VP, VBD, VLE, VBC, and VC) is depicted. The plot of failure rate vs. layout bins provides a first order indication of pattern dependency in test chip failures. With reference to FIG. 36, adding process margin splits to the plot provide a first order indication of process margin dependency in test chip failures.

With reference to FIG. 37, in one exemplary embodiment, a systematic defect identifier algorithm can analyze the test data vs. layout DOE factors (including process margin variants) and automatically identify patterns with statistically higher fail rate. As also depicted in FIG. 37, a summary of systematic vs. random fail rates can be shown in a bar chart format with systematic failures highlighted to the user through summary bar charts.

Another approach to classifying defects as random or systematic defects and predicting yield is described in U.S. Pat. No. 6,449,749, entitled SYSTEM AND METHOD FOR PRODUCT YIELD PREDICTION, issued on Sep. 10, 2002, which is incorporated herein by reference in its entirety. It should be recognized, however, that defects can be classified and yield can be modeled using various approaches.

V. SEM Inspection Tool

As described above, the results of the analysis can be used to localize the defects using an inspection tool. When an inspection tool is used, the test chip is adapted for use with the inspection tool by sizing the test structures to be compatible with the capabilities of the inspection tool.

For example, in one exemplary embodiment, the inspection tool is a SEMVision G2 tool produced by Applied Materials, Inc. of Santa Clara, Calif. USA. Thus, the test chip is adapted for use with the SEMVision G2 tool. More specifically, the test structures on the test chip are sized to be compatible with the view field and resolution of the SEMVision G2 tool.

Although exemplary embodiments have been described, various modifications can be made without departing from the spirit and/or scope of the present invention. Therefore, the present invention should not be construed as being limited to the specific forms shown in the drawings and described above.

We claim:

1. A method for fast localization of electrically measured defects of integrated circuits, comprising:
    (a) obtaining a test chip fabricated to have test structures configured for parallel electrical testing, wherein the test structures are grouped into one or more padgroups, wherein the test structures in a padgroup are electrically tested together in parallel;
    (b) electrically testing the test structures on the test chip employing a parallel electrical tester; and
    (c) analyzing results of the electrical testing to localize defects on the test chip.

2. The method of claim 1, further comprising:
    inspecting the localized defects on the test chip using an inspection tool.

3. The method of claim 2, wherein the inspection tool is a scanning electron microscope (SEM).

4. The method of claim 3, further comprising:
    sizing the test structures on the test chip to be compatible with a view field of the SEM.

5. The method of claim 1, wherein a padgroup includes:
    two columns of test structures; and
    two columns of pads disposed between the two columns of test structures.

6. The method of claim 1, further comprising:
    grouping padgroups into one or more sticks, wherein the padgroups in a stick are electrically tested together in parallel.

7. The method of claim 6, wherein the padgroups in a stick are electrically tested together in parallel using a probe card connected to the parallel electrical tester.

8. The method of claim 7, wherein one or more cells having test structures and corresponding pads are disposed between two padgroups in a stick, wherein the one or more cells are used to verify the operation of the probe card.

9. The method of claim 6, further comprising:
    stacking two or more sticks together in a layout.

10. The method of claim 9, further comprising:
    adjusting the number of sticks stacked together in the layout to fit within a scanner view field.

11. The method of claim 1, further comprising:
    in-line inspecting the test chip using an optical inspection tool.

12. The method of claim 1, wherein the test chip includes a plurality of design pattern variations.

13. The method of claim 1, wherein the test structures are two-terminal or four-terminal test structures.

14. The method of claim 1, wherein one of the test structures is a snakecomb cell configured to localize a defect in the snakecomb cell to a location within the snakecomb cell.

15. The method of claim 1, wherein electrically testing includes:
    comparing a line resistance to a first threshold resistance, wherein the line resistance is determined based on a measured voltage;
    when the line resistance is below the first threshold voltage, detecting a soft short;
    comparing the line resistance to a second threshold resistance; and
    when the line resistance is below the second threshold resistance, detecting a hard short, wherein the first threshold resistance is greater than the second threshold resistance.

16. The method of claim 1, wherein electrically testing includes:
    determining an average resistance for a number of lines adjacent to each other;
    comparing a line resistance to the average resistance;
    when the line resistance is less than the average resistance by a first specified amount, detecting a soft short; and
    when the line resistance is less than the average resistance by a second specified amount, detecting a hard short, wherein first specified amount is less than the second specified amount.

17. The method of claim 1, wherein the parallel electrical tester is connected to a wafer loader and a wafer prober, and further comprising:
    loading one or more test chips from the wafer loader into the wafer prober to be tested, and wherein the wafer prober includes a probe card to electrically contact the test structures on the test chip to be electrically tested in parallel.

18. The method of claim 17, further comprising:
    transmitting test signals between the probe card and a pin termination module in the parallel electrical tester;
    transmitting test signals between the pin termination module and a measurement control module in the parallel electrical tester; and
    transmitting commands to the wafer prober from a tester control module in the parallel electrical tester.

19. The method of claim 18, further comprising:
    providing voltage sources and transmitting control signals from the measurement control module to the pin termination module.

20. The method of claim 18, further comprising:
    receiving test signals from the probe card at a plurality of switch cards in the pin termination module, wherein each switch card is connected to a group of pins from the probe card.

21. The method of claim 20, wherein a switch card forms a resistor divider with a resister in a test structure, a termination resistor, and a voltage source.

22. The method of claim 20, wherein a switch card includes:
    a plurality of pin terminator circuits, wherein each pin terminator circuit is connected to a pin from the probe card; and
    a plurality of digital multiplexer controls, wherein each digital multiplexer control is connected to two pin terminator circuits.

23. The method of claim 22, wherein a pin terminator circuit includes a plurality of quad switches, wherein each quad switch is connected to a voltage source and control signals.

24. The method of claim 18, further comprising:
    receiving test signals from the probe card at a multiplexer module in the measurement control module;
    combining a set of test signals received from the probe card into a digital acquisition signal; and
    transmitting the digital acquisition signal to a digital acquisition card.

25. The method of claim 1, wherein analyzing results comprises:
    classifying detected defects as random or systematic defects.

26. The method of claim 25, further comprising:
    grouping test chip design patterns into layout bins; and
    plotting failure counts for each layout bin.

27. A system for fast localization of electrically measured defects of integrated circuits, comprising:
    (a) a test chip having test structures configured to be parallel electrically tested, wherein the test structures are grouped into one or more padgroups, wherein the test structures in a padgroup are electrically tested together in parallel;

(b) a parallel electrical tester configured to parallel electrically test the test structures on the test chip; and (c) a processor configured to analyze results from the parallel electrical tester to localize defects on the test chip.

28. The system of claim 27, further comprising:
an inspection tool configured to inspect the localized defects on the test chip.

29. The system of claim 28, wherein the inspection tool is a scanning electron microscope (SEM).

30. The system of claim 29, wherein the test structures on the test chip are sized to be compatible with a view field of the SEM.

31. The system of claim 27, wherein a padgroup includes:
two columns of test structures; and
two columns of pads disposed between the two columns of test structures.

32. The system of claim 27, wherein padgroups are grouped into one or more sticks, wherein the padgroups in a stick are electrically tested together in parallel.

33. The system of claim 32, wherein the padgroups in a stick are electrically tested together in parallel using a probe card connected to the parallel electrical tester.

34. The system of claim 33, wherein one or more cells having test structures and corresponding pads are disposed between two padgroups in a stick, wherein the one or more cells are used to verify the operation of the probe card.

35. The system of claim 32, wherein two or more sticks are stacked together in a layout.

36. The system of claim 35, wherein the number of sticks stacked together in the layout is adjusted to fit within a scanner view field.

37. The system of claim 27, further comprising:
an optical inspection tool to in-line inspect the test chip.

38. The system of claim 27, wherein the test chip includes a plurality of design pattern variations.

39. The system of claim 27, wherein the test structures are two-terminal or four-terminal test structures.

40. The system of claim 27, wherein one of the test structures is a snakecomb cell configured to localize a defect in the snakecomb cell to a location within the snakecomb cell.

41. The system of claim 27, wherein test structures are placed at more than one level.

42. The system of claim 41, wherein test structure below a test structure on another level is electrically tested.

43. The system of claim 41, wherein the interaction of test structures at two different levels is measured.

44. The system of claim 27, wherein the parallel electrical tester is configured to:
compare a line resistance to a first threshold resistance, wherein the line resistance is determined based on a measured voltage;
when the line resistance is below the first threshold voltage, detect a soft short;
compare the line resistance to a second threshold resistance; and
when the line resistance is below the second threshold resistance, detect a hard short, wherein the first threshold resistance is greater than the second threshold resistance.

45. The system of claim 27, wherein the parallel electrical tester is configured to:
determine an average resistance for a number of lines adjacent to each other;
compare a line resistance to the average resistance;
when the line resistance is less than the average resistance by a first specified amount, detect a soft short; and
when the line resistance is less than the average resistance by a second specified amount, detect a hard short, wherein first specified amount is less than the second specified amount.

46. The system of claim 27, wherein the parallel electrical tester is connected to a wafer loader and a wafer prober, wherein the wafer loader loads one or more test chips into the wafer prober to be tested, and wherein the wafer prober includes a probe card to electrically contact the test structures on the test chip to be electrically tested in parallel.

47. The system of claim 46, wherein the parallel electrical tester includes:
a pin termination module connected to the probe card, wherein test signals are transmitted between the pin termination module and the probe card;
a measurement control module connected to the pin termination module, wherein test signals are transmitted between the pin termination module and the measurement control module; and
a tester control module connected to the measurement control module and the wafer prober, wherein the tester control module sends commands to the wafer prober.

48. The system of claim 47, wherein the measurement control module provides voltages source and control signals to the pin termination module.

49. The system of claim 46, wherein the pin termination module includes:
a plurality of switch cards to receive test signals from the probe card, wherein each switch card is connected to a group of pins from the probe card.

50. The system of claim 46, wherein a switch card forms a resistor divider with a resister in a test structure, a termination resistor, and a voltage source.

51. The system of claim 49, wherein a switch card includes:
a plurality of pin terminator circuits, wherein each pin terminator circuit is connected to a pin from the probe card; and
a plurality of digital multiplexer controls, wherein each digital multiplexer control is connected to two pin terminator circuits.

52. The system of claim 51, wherein a pin terminator circuit includes a plurality of quad switches, wherein each quad switch is connected to a voltage source and control signals.

53. The system of claim 47, wherein the measurement control module includes:
a multiplexer module that receives test signals from the probe card; and
a digital acquisition card, wherein the multiplexer module combines a set of test signals received from the probe card into a digital acquisition signal sent to the digital acquisition card.

54. The system of claim 27, wherein the processor is configured to:
classify detected defects as random or systematic defects.

55. The system of claim 54, wherein the processor is configured to:
group test chip design patterns into layout bins; and
plot failure counts for each layout bin.

56. A computer-readable storage medium containing computer executable code to instruct a computer to localize electrically measured defects of integrated circuits by instructing the computer to operate as follows:
sending control signals from a parallel electrical tester to a test chip fabricated to have test structures configured for parallel electrical testing, wherein the test structures are grouped into one or more padgroups, wherein the test structures in a padgroup are electrically tested together in parallel; and analyzing results of the electrical testing to localize defects on the test chip.

* * * * *